US008829578B2

(12) United States Patent
Maeda

(10) Patent No.: US 8,829,578 B2
(45) Date of Patent: Sep. 9, 2014

(54) SOLID-STATE IMAGING DEVICE

(71) Applicant: Kabushiki Kaisha Toshiba, Tokyo (JP)

(72) Inventor: Motohiro Maeda, Oita (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 35 days.

(21) Appl. No.: 13/621,956

(22) Filed: Sep. 18, 2012

(65) Prior Publication Data

US 2013/0076934 A1 Mar. 28, 2013

(30) Foreign Application Priority Data

Sep. 22, 2011 (JP) ................................. 2011-207093

(51) Int. Cl.
*H01L 31/113* (2006.01)
*H01L 27/146* (2006.01)
*H04N 5/3745* (2011.01)

(52) U.S. Cl.
CPC ...... *H04N 5/37457* (2013.01); *H01L 27/14603* (2013.01); *H01L 27/14641* (2013.01); *H01L 27/14614* (2013.01)
USPC ............. 257/292; 257/E27.131; 257/E27.132

(58) Field of Classification Search
CPC ................................................ H01L 27/14603
USPC ........................... 257/292, E27.131, E27.132
See application file for complete search history.

(56) References Cited

U.S. PATENT DOCUMENTS

| 7,364,960 | B2 * | 4/2008 | Lyu ................................ 438/204 |
| 7,405,437 | B2 * | 7/2008 | Shim et al. ..................... 257/292 |
| 7,572,701 | B2 * | 8/2009 | Adkisson et al. .............. 438/259 |
| 7,741,143 | B2 * | 6/2010 | Paik et al. ......................... 438/57 |
| 8,471,313 | B2 * | 6/2013 | Takahashi ...................... 257/292 |
| 8,487,350 | B2 * | 7/2013 | Nozaki et al. .................. 257/225 |
| 2006/0138486 | A1 * | 6/2006 | Lim ............................... 257/292 |
| 2007/0034965 | A1 * | 2/2007 | Jung et al. ..................... 257/369 |

FOREIGN PATENT DOCUMENTS

| JP | 2000-124437 A | 4/2000 |
| JP | 2004-356246 A | 12/2004 |
| JP | 2009-302103 A | 12/2009 |
| JP | 2010-114273   | 5/2010 |

OTHER PUBLICATIONS

Office Action issued on Dec. 10, 2013 in the corresponding Japanese Patent Application No. 2011-207093 (with English Translation).

* cited by examiner

*Primary Examiner* — John C Ingham
(74) *Attorney, Agent, or Firm* — Oblon, Spivak, McClelland, Maier & Neustadt, L.L.P.

(57) ABSTRACT

According to one embodiment, a solid-state imaging device includes a unit cell forming region in a pixel array of a semiconductor substrate, a pixel which is provided in the unit cell forming region and generates a signal charge based on a light signal, and an amplification transistor which is provided in the unit cell forming region and amplifies a potential associated with the signal charge transferred from the pixel to a floating diffusion. The amplification transistor includes a gate electrode having one or more first embedded portions embedded in one or more trenches in the semiconductor substrate through a first gate insulating film.

15 Claims, 14 Drawing Sheets

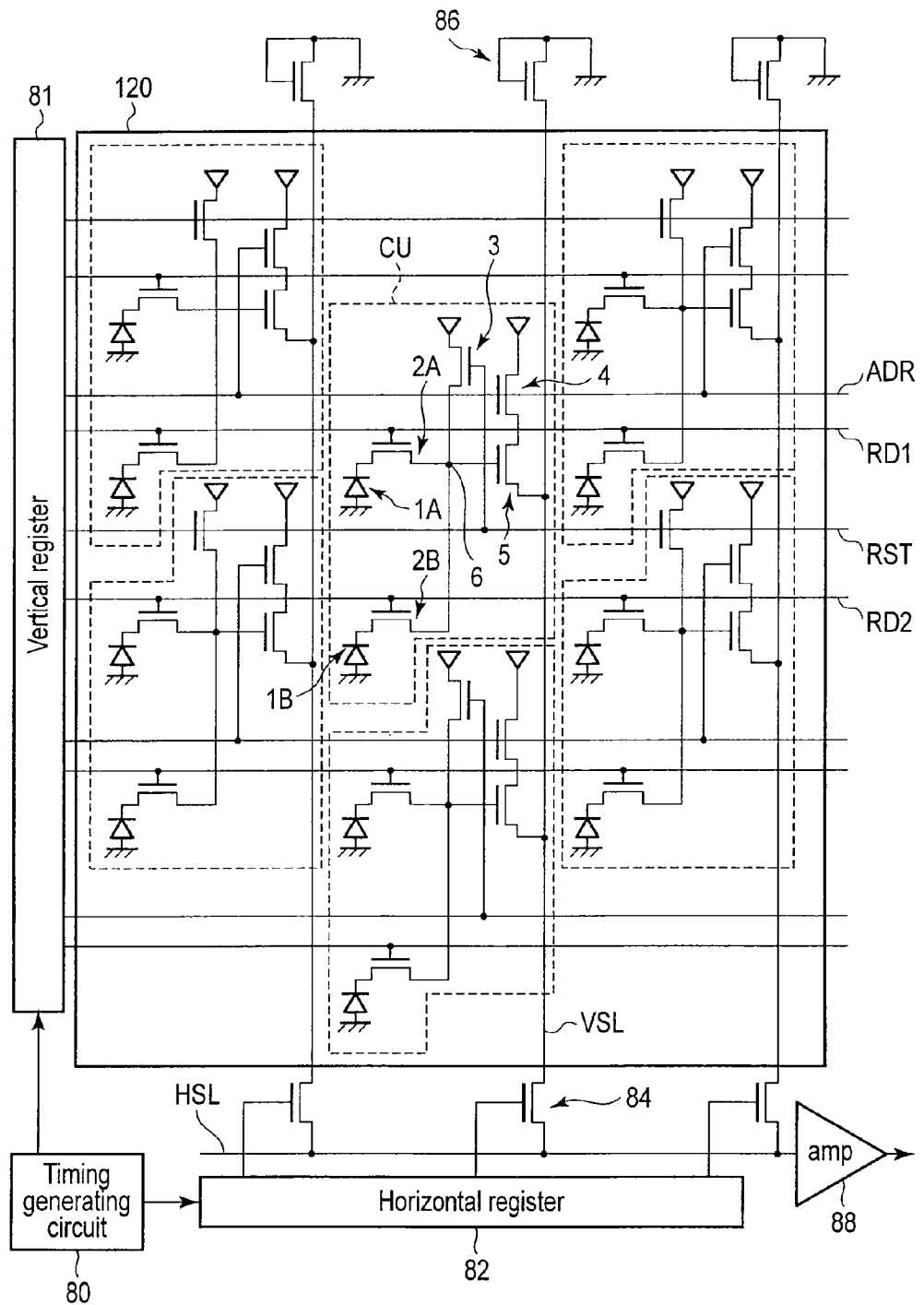
F I G. 3

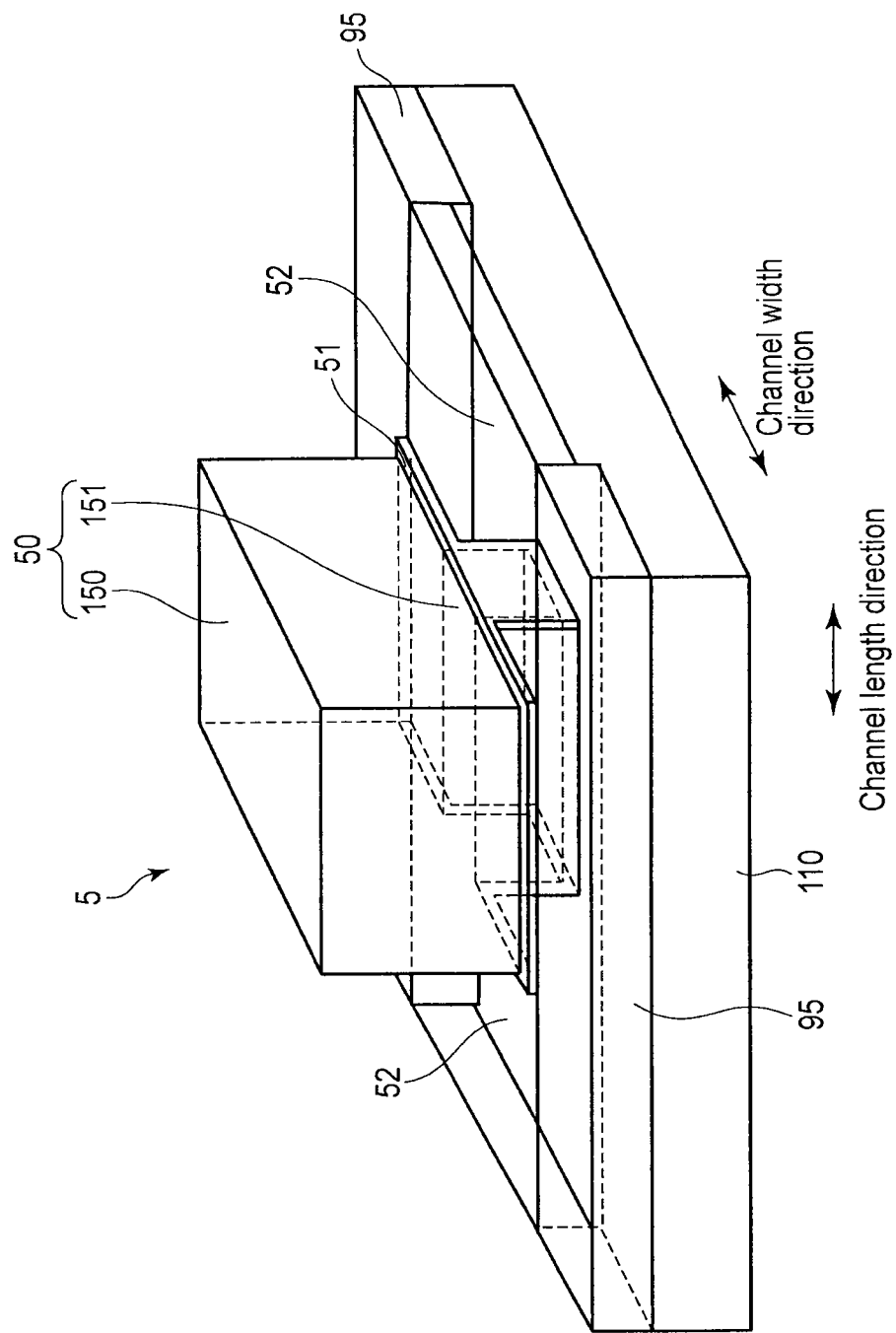
F I G. 5

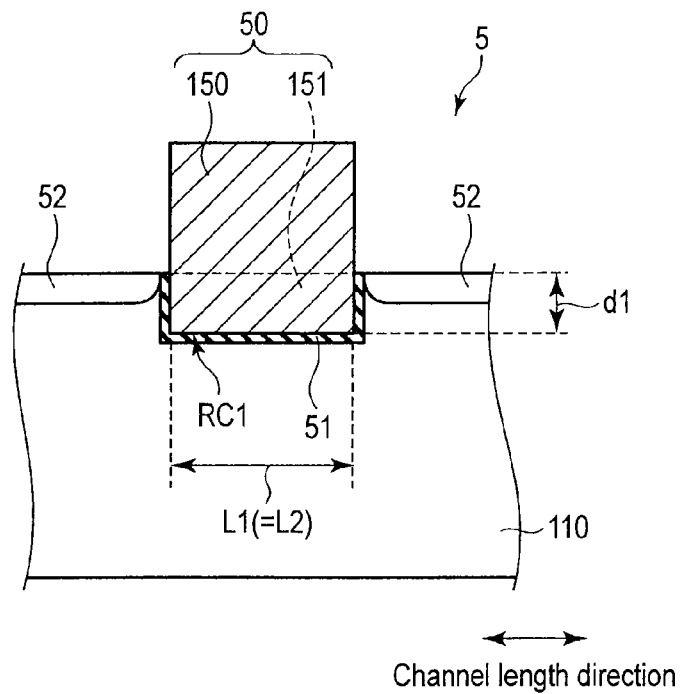
F I G. 6A
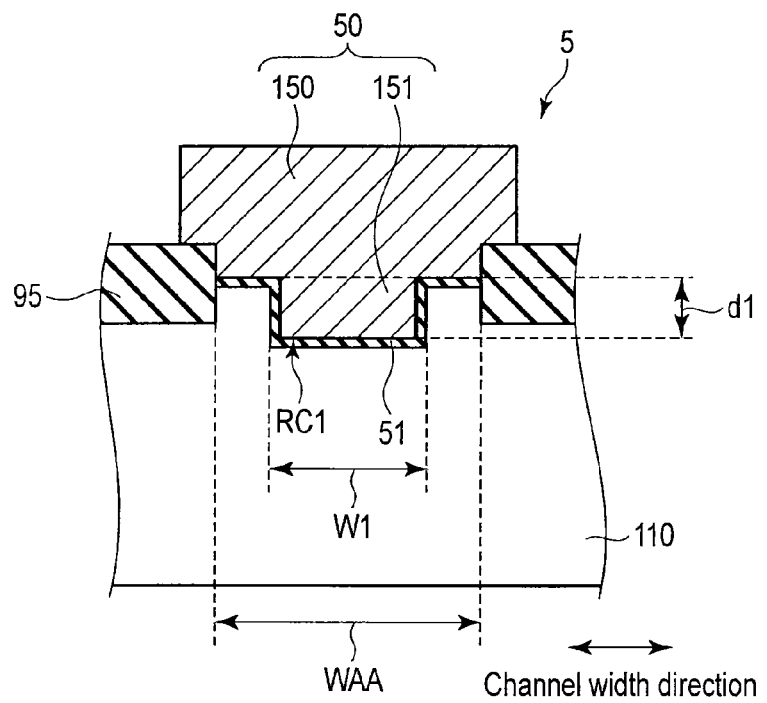
F I G. 6B

8,829,578 B2

SOLID-STATE IMAGING DEVICE

CROSS-REFERENCE TO RELATED APPLICATIONS

This application is based upon and claims the benefit of priority from Japanese Patent Application No. 2011-207093, filed Sep. 22, 2011, the entire contents of which are incorporated herein by reference.

FIELD

Embodiments described herein relate generally to a solid-state imaging device.

BACKGROUND

In a solid-state imaging device such as a CCD image sensor or a CMOS image sensor, miniaturization of a pixel size is advanced based on an increase in number of pixels or a reduction in optical size.

Some of elements to control output of a signal from pixels (for example, a field-effect transistor) are provided in the vicinity of the pixels in a pixel array. Therefore, with promotion of miniaturization of the pixels, the control elements in the pixel array are also miniaturized.

There is a possibility that characteristics of the elements are deteriorated and influence of noise with respect to a signal from the pixels is increased because of such miniaturization of the pixels and the elements. As a result, an image quality of an image formed based on the signal from the pixels may be possibly deteriorated.

BRIEF DESCRIPTION OF THE DRAWINGS

FIG. 3 is a view showing an example of a circuit configuration of the pixel array in the solid-state imaging device according to the embodiment;

FIG. 5 is a bird's eye view showing a configuration of an element in a unit cell in the solid-state imaging device according to the embodiment;

FIG. 6A is a cross-sectional view showing the configuration of the element in the unit cell in the solid-state imaging device according to the embodiment;

FIG. 6B is a cross-sectional view showing the configuration of the element in the unit cell in the solid-state imaging device according to the embodiment;

DETAILED DESCRIPTION

This embodiment will now be described hereinafter in detail with reference to the accompanying drawings. In the following description, like reference numbers denote elements having the same functions and structures, and a tautological explanation will be given as required.

In general, according to one embodiment, a solid-state imaging device includes a unit cell forming region provided in a pixel array of a semiconductor substrate; a pixel which is provided in the unit cell forming region and generates a signal charge based on a light signal from a subject; and an amplification transistor which is provided in the unit cell forming region and amplifies a potential associated with the signal charge transferred from the pixel to a floating diffusion. The amplification transistor includes a gate electrode having one or more first embedded portions embedded in one or more first trenches in the semiconductor substrate through a first gate insulating film.

(1) First Embodiment

A solid-state imaging device according to a first embodiment will now be described with reference to FIG. 1 to FIG. 10B.

(a) Configuration

A configuration of the solid-state imaging device according to the first embodiment will now be described with reference to FIG. 1 to FIG. 8.

Figure 1:
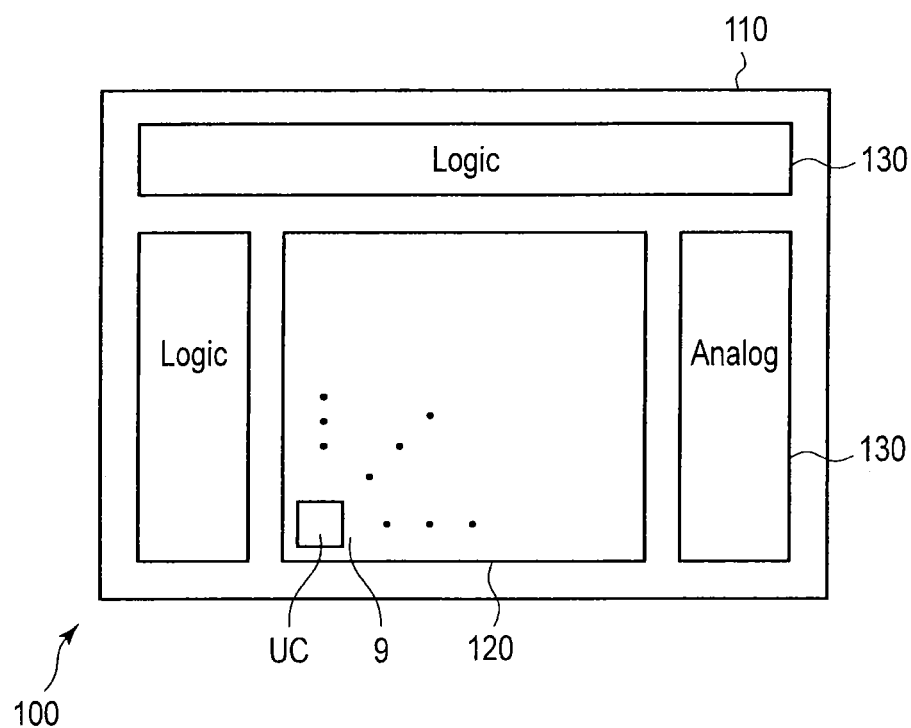
FIG. 1 is a view showing an example of a chip layout of a solid-state imaging device according to an embodiment.
Figure 2:
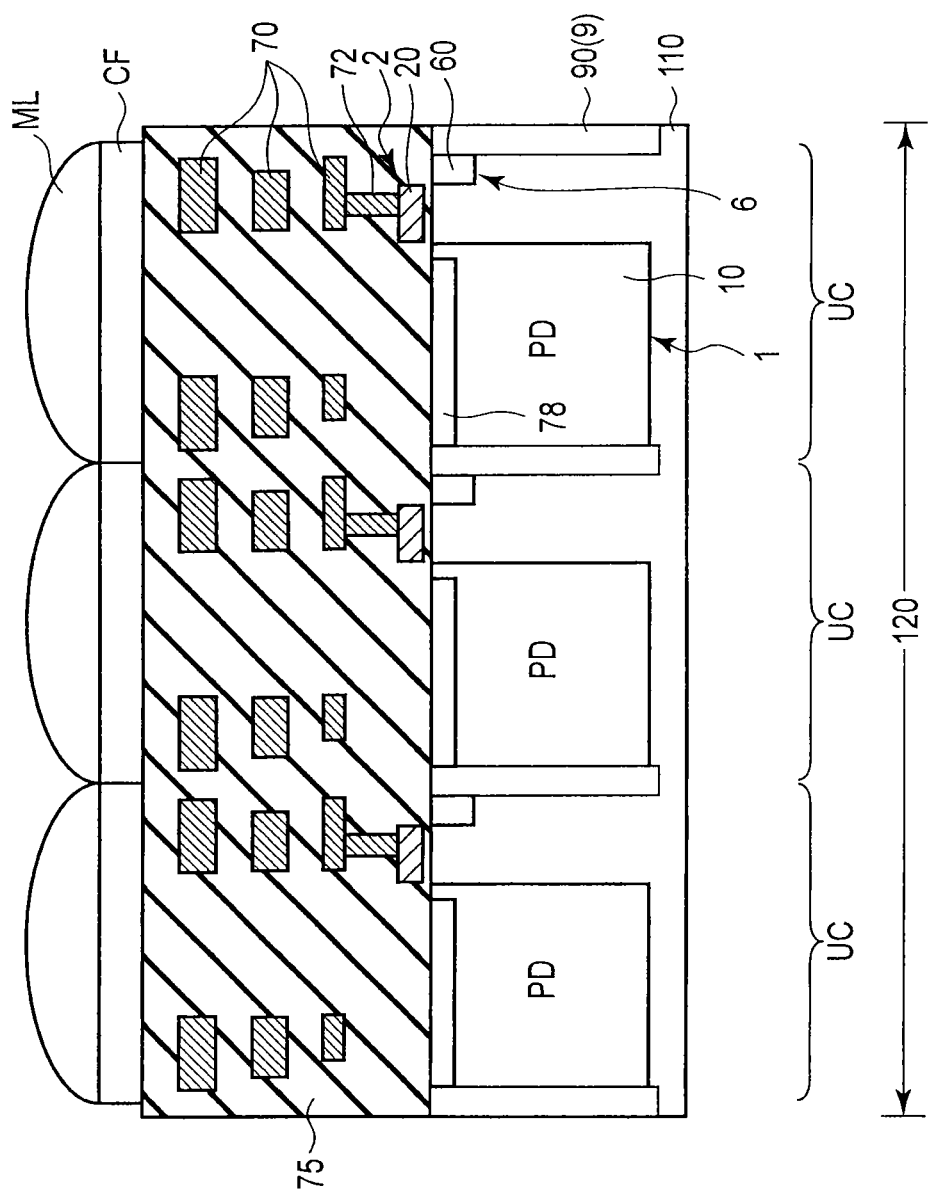
FIG. 2 is a cross-sectional view showing an example of a configuration of a pixel array in the solid-state imaging device according to the embodiment.

FIG. 1 is a schematic view showing a layout example of a chip in a solid-state imaging device (which will be referred to as an image sensor hereinafter) according to this embodiment. FIG. 2 is a view showing a circuit configuration of a pixel array and the vicinity thereof.

As shown in FIG. 1, in an image sensor 100 according to this embodiment, a pixel array 120 and each circuit (an analog circuit or a logic circuit) 130 to control operations of the pixel array 120 are provided in one semiconductor substrate (a chip) 110.

The pixel array 120 includes unit cells UC.

Each unit cell UC includes a photoelectric conversion unit (which will be referred to as a pixel hereinafter) to convert incident light from the outside into an electrical signal. One unit cell UC includes at least one pixel. The pixel is formed using, for example, a photoelectric conversion element such as a photodiode.

Each unit cell UC includes a pixel control unit (which is also called a signal scan unit) that controls output of a signal from the pixel to be associated with the pixel. A control element in the pixel control unit is formed using, for example, a field-effect transistor. The pixel control unit includes control elements called a transfer gate or an amplification transistor.

Each unit cell UC includes a signal detection unit. When a signal of the pixel is output, the signal detection unit holds this signal. For example, the signal detection unit is formed using an impurity semiconductor layer (a diffusion layer) in the semiconductor substrate. The diffusion layer as the signal detection unit is called floating diffusion.

Particulars of an internal configuration of the unit cell UC will be described later.

The unit cells UC adjacent to each other and pixels included therein are electrically isolated by an element isolating region (an element isolation unit) 9 in the semiconductor substrate 110. Regions where the respective unit cells and the pixels are formed are surrounded by the element isolating region 9.

The element isolating region is provided between the pixel array 120 and the analog/logic circuits (which are also called peripheral circuits) 130 in the semiconductor substrate 110.

FIG. 2 shows a cross-sectional configuration of the pixel array 120 according to this embodiment. It is to be noted that FIG. 2 shows photodiodes 1 which are the pixels 1 and transfer gates 2 which are the control elements 2 alone as constituent elements of the unit cell UC for simplicity of the drawing. Moreover, in FIG. 2, the analog/logic circuits formed in the same chip 110 as the pixel array 120 are omitted for simplicity of the drawing.

In the pixel array 120 of the semiconductor substrate 110, the unit cells UC are provided.

The photodiodes 1 as the pixels are provided in, for example, a P-type semiconductor substrate 110. The photodiode 1 includes, for example, at least one impurity semiconductor layer 10 provided in the P-type semiconductor substrate 110. The impurity semiconductor layer 10 has, for example, N-type conductivity. The photodiode 1 converts a light signal from a subject into an electrical charge (a signal charge) associated with luminous energy of the light signal. The photodiode 1 stores the converted electrical charge.

Floating diffusion 6 is formed of an N-type impurity semiconductor layer 60 provided in the semiconductor substrate 110.

The field-effect transistor as the transfer gate 2 is provided between the photodiode 1 and the floating diffusion 6. A gate electrode 20 of each transfer gate 2 is formed above the semiconductor substrate 110 through a gate insulating film (for example, a silicon oxide film).

When reading out a signal charge stored in the photodiode 1, the transfer gate is turned on. A channel (a reversal layer) is formed in the semiconductor substrate 110 below the gate electrode 20 of the conducting transfer gate 2, i.e., in a channel region of the transistor 2. The signal charge of the photodiode 1 in the impurity semiconductor layer 10 is transferred to the floating diffusion 6 through this channel.

The signal charge output to the floating diffusion 6 is detected and amplified by the control element in the pixel control unit connected to the pixel, and it is output to the outside of the unit cell UC and the pixel array 120.

On a surface of the photodiode 1 (an interlayer insulating film 75 side), a surface shield layer 78 is provided. The surface shield layer 78 is an impurity semiconductor layer (for example, a P-type impurity semiconductor layer). For example, the surface shield layer 78 is provided in a surface layer of the impurity semiconductor layer 10 included in the photodiode 1 to be a part from the channel region of the transfer gate 2. An upper surface of the surface shield layer 78 is in contact with the interlayer insulating film 75. The surface shield layer 78 suppresses diffusion of an impurity (for example, carbon) produced by the interlayer insulating film 75 into the impurity semiconductor layer 10 included in the photodiode 1.

As described above, the element isolating region 9 is provided between the respective unit cells UC. In the element isolating region 9, each element isolating layer 90 is provided in the semiconductor substrate 110. The element isolating layer 90 electrically isolates the unit cells UC adjacent to each other. The element isolating layer 90 may be an impurity semiconductor layer formed in the semiconductor substrate 110 or an insulator embedded in an element isolation trench in the semiconductor substrate 110.

The interlayer insulating film 75 covers a gate electrode 20 of each field-effect transistor 2 formed on the semiconductor substrate 110. In the interlayer insulating film 75, metal layers 70 as interconnects or light shielding layers are provided. The interlayer insulating film 75 and the metal layers 70 in the interlayer insulating film 75 are formed by a multilayer interconnect technology. The metal layers 70 on different interconnect levels are connected through plugs 72 embedded in the interlayer insulating film 75. For example, the metal layer 70 is formed using aluminum (Al) or copper (Cu). The respective elements isolated by the element isolation layers 90 are connected to each other through the metal layers 70 as the interconnects and the plugs 72.

In the following description, a surface (a first surface) on which the gate electrode 20 of the field-effect transistor 2 and the interlayer insulating film 75 are provided will be referred to as a front surface of the semiconductor substrate 110, and a surface (a second surface) opposed to this surface in the vertical direction will be referred to as a back surface of the semiconductor substrate 110. It is to be noted that the semiconductor substrate 110 may be a silicon single crystal substrate or a semiconductor layer of a silicon-on-insulator (SOI) substrate.

For example, the image sensor 100 according to this embodiment includes the single-chip (single-plate) pixel array 120. As to the single-plate pixel array 120, the single pixel array 120 acquires pieces of color information. In association with each of the pixels, a filter of at least one color selected from red, blue, and green is disposed.

As shown in FIG. 2, each color filter CF is provided above the pixel array 120 through the interlayer insulating film 75 on the semiconductor substrate 110. A protective film (not shown) and/or an adhesive layer (not shown) is provided between the color filter CF and the interlayer insulating film 75. The color filter CF has a pattern that filters, each of which allows any one color (light in a corresponding wavelength band) of red (R), green (G), and blue (B) to be transmitted therethrough, are arranged. The filters are arranged in a predetermined pattern in such a manner that one color filter is associated with one pixel. As a result, the single-chip image sensor is formed. It is to be noted that the color filter CF may include a filter of white (W) that allows transmission of all wavelength regions of visible light or a filter of yellow in addition to red, green, and blue. The color filter CF has an arrangement pattern such as a Bayer arrangement or WRGB arrangement.

A microlens array ML is provided above the pixel array 120 through each color filter CF. The microlens array ML is formed by two-dimensionally arranging one microlens associated with one pixel (the photodiode). The microlens array ML condenses light with respect to the image sensor from a subject. The light from the subject is applied to the photodiode 1 in the unit cell UC through the microlens ML, the color filter CF, and the interlayer insulating film 75.

In the image sensor 100 according to this embodiment, a surface where the interlayer insulating film 75 including the multilayer interconnects are provided (a surface where the element is formed) serves as a light receiving surface for the light from the subject.

As with this embodiment, the image sensor in which the microlenses ML and the color filters CF are provided on the interlayer insulating film 75 on the front surface of the semiconductor substrate 110 and light that enters from the front surface side of the semiconductor substrates 10 is photoelectrically converted is called a front-side illumination type image sensor.

It is to be noted that a pad (not shown) may be provided on the interlayer insulating film 75 above a region where the analog circuit and the logic circuit are provided. The pad is connected to the interconnects 70 and the element (the transistor) through the plug provided in the interlayer insulating film 75. Further, the pad may be provided on the back surface of the semiconductor substrate 110. The pad provided on the back surface of the semiconductor substrate 110 is connected to the interconnects 70 and the element through an electrode that pierces the semiconductor substrate 110 (which is also referred to as a through electrode). The pad electrically connects the chip including the image sensor to another chip (for example, a driver chip) or a power supply.

FIG. 3 is a view showing a circuit configuration example of the pixel array 120 and the adjacent circuits.

The unit cells UC are arranged in the pixel array 120. Each unit cell UC is arranged at an intersecting position of a read control line RD1 or RD2 and a vertical signal line VSL.

The unit cell UC shown in FIG. 3 has a two-pixel one-cell structure that one unit cell UC includes two pixels A1 and 1B. In the unit cell UC having the two-pixel one-cell structure, a part of the pixel control unit and the signal detection unit are common to the two pixels (the photoelectric conversion units) 1A and 1B.

The pixel control unit of the unit cell UC is formed of, for example, five field-effect transistors 2A, 2B, 3, 4, and 5. Each of the field-effect transistors 2A, 2B, 3, 4, and 5 is, for example, an re-channel MOS transistor. The five field-effect transistors included in the unit cell UC will be referred to as transfer gates 2A and 2B, an amplification transistor 5, an address transistor 4, and a reset transistor 3.

In the unit cell UC having the two-pixel one-cell structure, the two transfer gates 2A and 2B are provided in association with the respective pixels 1A and 1B, respectively.

The pixels 1A and 1B in the unit cell UC are formed of photodiodes 1A and 1B.

Anodes of the photodiodes 1A and 1B are grounded (connected to ground terminals). Cathodes of the photodiodes 1A and 1B are connected to the floating diffusion as the signal detection unit 6 through current paths of the transfer gates 2A and 2B. As described above, the photodiodes 1A and 1B convert light that has passed through the microlenses and the color filters into electrical signals (signal charges) and store the electrical charges. A potential difference is produced between terminals of the photodiodes 1A and 1B by the electrical charges in the photodiodes 1A and 1B. In the following description, when the photodiodes 1A and 1B are not discriminated from each other, they are referred to as a photodiode 1.

The transfer gates 2A and 2B control storage and discharge of the signal charges in the photodiodes 1A and 1B, respectively. Gates of the transfer gates 2A and 2B are connected to the read control lines RD1 and RD2, respectively. One end of the current path of each of the transfer gates 2A and 2B is connected to the cathode of each of the photodiodes 1A and 1B. The other end of the current path of each of the transfer gates 2A and 2B is connected to the floating diffusion FD. In the following description, when the transfer gates 2A and 2B are not discriminated from each other, they are referred to as a transfer gate 2. The transfer gate 2 is also called a read transistor.

In the unit cell UC having the two-pixel one-cell structure, the reset transistor 3, the address transistor 4, and the amplification transistor 5 are shared by the two pixels 1A and 1B.

The reset transistor 3 resets a potential in the floating diffusion FD (a gate potential in the amplification transistor 5). A gate of the reset transistor 3 is connected to a reset control line RST. One end of a current path of the reset transistor 3 is connected to the floating diffusion FD, and the other end of the current path of the reset transistor 3 is connected to a power supply terminal (for example, the ground terminal). The reset transistor 3 is also referred to as a reset gate.

The address transistor 4 functions as a selection element to select (activate) the unit cell UC. A gate of the address transistor 4 is connected to an address control line ADR. One end of a current path of the address transistor 4 is connected to the other end of a current path of the amplification transistor 5, and the other end of the current path of the address transistor 4 is connected to the power supply terminal (for example, the ground terminal). The address transistor 4 is also referred to as an address gate or a row selection transistor.

The amplification transistor 5 amplifies a signal from the pixel 1 held in the floating diffusion FD. A gate of the amplification transistor 5 is connected to the floating diffusion FD. One end of the current path of the amplification transistor 5 is connected to the vertical signal line VSL, and the other end of the current path of the amplification transistor 5 is connected to the one end of the current path of the address transistor 4. The signal amplified by the amplification transistor 5 is output to the vertical signal line VSL as a signal of the unit cell (or the pixel). The amplification transistor 5 functions as a source follower in the unit cell UC. The amplification transistor 5 is also referred to as an amplification gate.

It is to be noted that the unit cell UC may not include the address transistor 4. In this case, the address control line ADR is not provided, and the other end of the current path of the amplification transistor 5 is connected to the power supply terminal (for example, the ground terminal).

In the image sensor 100 according to this embodiment, the unit cell UC is not restricted to the two-pixel one-cell structure. For example, one unit cell UC may include three or more pixels (photodiodes) such as a four-pixel one-cell structure or an eight-pixel one-cell structure, and three or more pixels may share one piece of floating diffusion (the signal detection unit) 6 and one pixel control unit 3, 4, or 5 in one unit cell UC. The image sensor 100 according to this embodiment may have a one-pixel one-cell structure that one unit cell UC includes one pixel (photodiode).

For example, the unit cells UC are arranged in the pixel array 120 at a pitch of approximately 2 to 3 μm or a pitch of 2 μm or below.

As the peripheral circuits 130 that control operations of the pixel array 120, a timing generation circuit 80, a vertical shift register 81, a horizontal shift register 82, an amplification circuit 83, a horizontal selection switch transistor 84, and a load transistor 86 are provided in the same chip 110 as the pixel array 120. It is to be noted that peripheral circuits other those described above are provided in the same chip 110 as the pixel array 120.

The timing generation circuit 80 controls operation timing of the pixel array 120. The timing generation circuit 80 controls timing for generation control signals output from the vertical shift register 81 and the horizontal shift register 82.

The vertical shift register 81 are connected to the read control lines RD1 and RD2, the address control line ADR, and the reset control line RST. The vertical shift register 81 controls potentials in the read control lines RD1 and RD2, the address control line ADR, and the reset control line RST based on the operation timing specified by the timing generation circuit 80 and selects the unit cells UC in the pixel array 120 in rows. That is, the vertical shift register 81 outputs control signals (voltage pulses) to turn the transistors 2A, 2B, 3, 4, and 5 in each unit cell to the respective control lines RD1, RD2, RST, and ADR on and off at predetermined operation timing. Further, the vertical shift register 81 collectively turns on or off the transistors connected to the common control lines RD1, RD2, RST, and ADR.

The horizontal shift register 82 is connected to a gate of the horizontal selection transistor 84. The horizontal shift register 82 supplies a horizontal selection pulse to the gate of the horizontal selection transistor 84 based on the operation timing specified by the timing generation circuit 80 and controls columns in the pixel array 120.

One end of a current path of the horizontal selection transistor 84 is connected to a horizontal signal line HSL, the other end of the current path of the horizontal selection transistor 84 is connected to one end of the vertical signal line VSL. The horizontal selection transistor 84 is activated or deactivated by a horizontal selection pulse from the horizontal shift register 82.

One end of a current path of the load transistor 86 is connected to the other end of the vertical signal line VSL. The load transistor 86 is subjected to diode connection. That is, the other end of the current path of the load transistor 86 is connected to a gate of the load transistor 86. The other end of the current path of the load transistor 86 is connected to the power supply terminal (for example, the ground terminal). The load transistor 86 is used as a constant current source for the vertical signal line VSL.

An input terminal of the amplification circuit 88 is connected to the horizontal signal line HSL. The amplification circuit 88 detects and amplifies a signal from the unit cell UC that is output to the horizontal signal line HSL from the vertical signal line VSL through the conducting horizontal selection transistor.

The signal of the unit cell UC amplified by the amplification circuit 88 is output to a circuit in a subsequent stage, for example, an analog-to-digital conversion circuit or an image processing circuit.

A signal from the pixel array 120 is subjected to analog-to-digital conversion processing or correlated double sampling (CDS) processing by the analog-to-digital conversion circuit. Furthermore, an output signal (digital data) from the analog-to-digital conversion circuit is subjected to correction processing or characteristic amount calculation processing by the image processing circuit. As a result, for example, an image corresponding to one frame of the pixel array 120 is formed.

An example of an operation of the image sensor will now be described.

Based on the operation timing specified by the timing generation circuit 80, the reset control line RST associated with a selected row in the pixel array 120 is made high by the vertical shift register 81, and the reset transistor 3 is turned on. As a result, a potential in the floating diffusion 6 is reset.

Additionally, based on the operation timing specified by the timing generation circuit 80, the address control line ADR associated with the selected row in the pixel array 120 is made high by the vertical shift register 81. As a result, the address transistor 4 is turned on. The other end of the current path of the amplification transistor 5 is connected to the power supply terminal (for example, the ground terminal) through the address transistor 4 which is in the on-state.

The potential in the floating diffusion 6 which is in the reset state is applied to the gate of the amplification transistor 5. In accordance with intensity of the potential in the floating diffusion 6, the amplification transistor 5 is driven. In accordance with driving force of the amplification transistor 5 to which the potential in the reset state has been applied, a potential in the vertical signal line VSL fluctuates.

In this manner, an output signal from the amplification transistor 5 driven by the potential in the floating diffusion 6 which is in the reset state is output to the vertical signal line VSL as an output from the unit cell UC. In this embodiment, an output signal from the unit cell when the floating diffusion 6 is in the reset state will be referred to as a reset signal or a reset voltage.

Based on the operation timing specified by the timing generation circuit 80, each horizontal selection transistor 84 is turned on by a horizontal selection pulse from the horizontal shift register 82. As a result, the reset signal output to the vertical signal line VSL is output to the amplification circuit 88 through the current path (a channel) of the conducting horizontal selection transistor 84 and the horizontal signal line HSL. The amplification circuit 88 detects and amplifies the acquired reset signal and outputs this signal to a circuit in a subsequent stage (for example, the analog-to-digital conversion circuit or the image processing circuit).

The reset control line RST is made low, and the reset transistor 3 is turned off. The potential in the floating diffusion 6 enters a floating state. Each of the photodiodes 1A and 1B in the unit cell UC acquires light from a subject at predetermined operation timing and converts a light signal of this light into an electrical signal (a signal charge). The photodiodes 1A and 1B store the signal charges.

During this period, signals levels of the read control lines RD1 and RD2 are made low (for example, approximately −1.0 V). The transfer gates 2A and 2B associated with the two photodiodes 1A and 1B in the unit cell UC, respectively are in the off-state.

Based on the operation timing specified by the timing generation circuit 80, the vertical shift register 81 outputs a high read control signal (for example, a signal of approximately 5 V). The high signal is applied to gates of the transistors as the transfer gates 2A and 2B through the read control lines RD1 and RD2, and the transfer gates 2A and 2B are turned on. The signal charges stored in the two photodiodes 1A and 1B in the unit cell UC are read to the floating diffusion 6 through the current paths (the channel) of the transfer gates which are in the on-state.

Additionally, the address transistor 4 is turned on at predetermined timing, and the other end of the current path of the amplification transistor 5 is connected to the power supply terminal.

The potential in the floating diffusion 6 associated with a signal charge amount from the photodiode 1 is applied to the gate of the amplification transistor 5. In accordance with intensity of the potential in the floating diffusion 6 (the signal charge amount from the photodiode 1), the amplification transistor 5 is driven. In accordance with driving force of the amplification transistor 5 to which the potential associated with the signal charge amount has been applied, the potential in the vertical signal line VSL fluctuates.

In this manner, an output signal from the amplification transistor 5 driven based on the potential in the floating diffusion 6 which is in the signal charge holding state is output to the vertical signal line VSL as an output from the unit cell UC. An output signal from the unit cell when the floating diffusion 6 holds the signal charge from the photodiode will be referred to as a pixel signal or a pixel voltage.

Further, each horizontal selection transistor 84 is turned on by a horizontal selection pulse from the horizontal shift register 82 at the specified operation timing. As a result, the pixel signal output to the vertical signal line VSL is output to the amplification circuit 88 through the current path (the channel) of each horizontal selection transistor which is in the on-state. The amplification circuit 88 detects and amplifies the acquired pixel signal and outputs this signal to a circuit in a subsequent stage (for example, the analog-to-digital conversion circuit and/or the image processing circuit).

The above-described processing steps are sequentially executed in rows in the pixel array 120.

For example, the reset signal and the pixel signal from the unit cell UC are subjected to digital conversion processing and correlated double sampling (CDS) processing by a circuit in the subsequent stage (for example, the analog-to-digital conversion circuit), thereby forming digital pixel data. Based on the formed pixel data, the circuit in the subsequent stage (for example, the image processing circuit) forms an image corresponding to one frame in the pixel array 120.

Here, there is shown an example where electrical conduction of both photodiodes 1A and 1B in one unit cell UC is achieved with respect to the floating diffusion 6 at the same time. However, in accordance with characteristics (for example, light intensities) of the respective photodiodes 1A and 1B, the potentials in the two read control lines RD1 and RD2 may be controlled in such a manner that electrical conduction of the photodiodes 1A and 1B can be achieved with respect to the floating diffusion 6 one by one. As a result, the transfer gates 2A and 2B in the unit cell UC are activated (turned on) one by one.

It is to be noted that the operation of the image sensor described in this embodiment is just an example, the operation of the image sensor is appropriately changed in accordance with a circuit configuration of the unit cell UC or configurations of the pixel array and the peripheral circuits.

Figure 4:
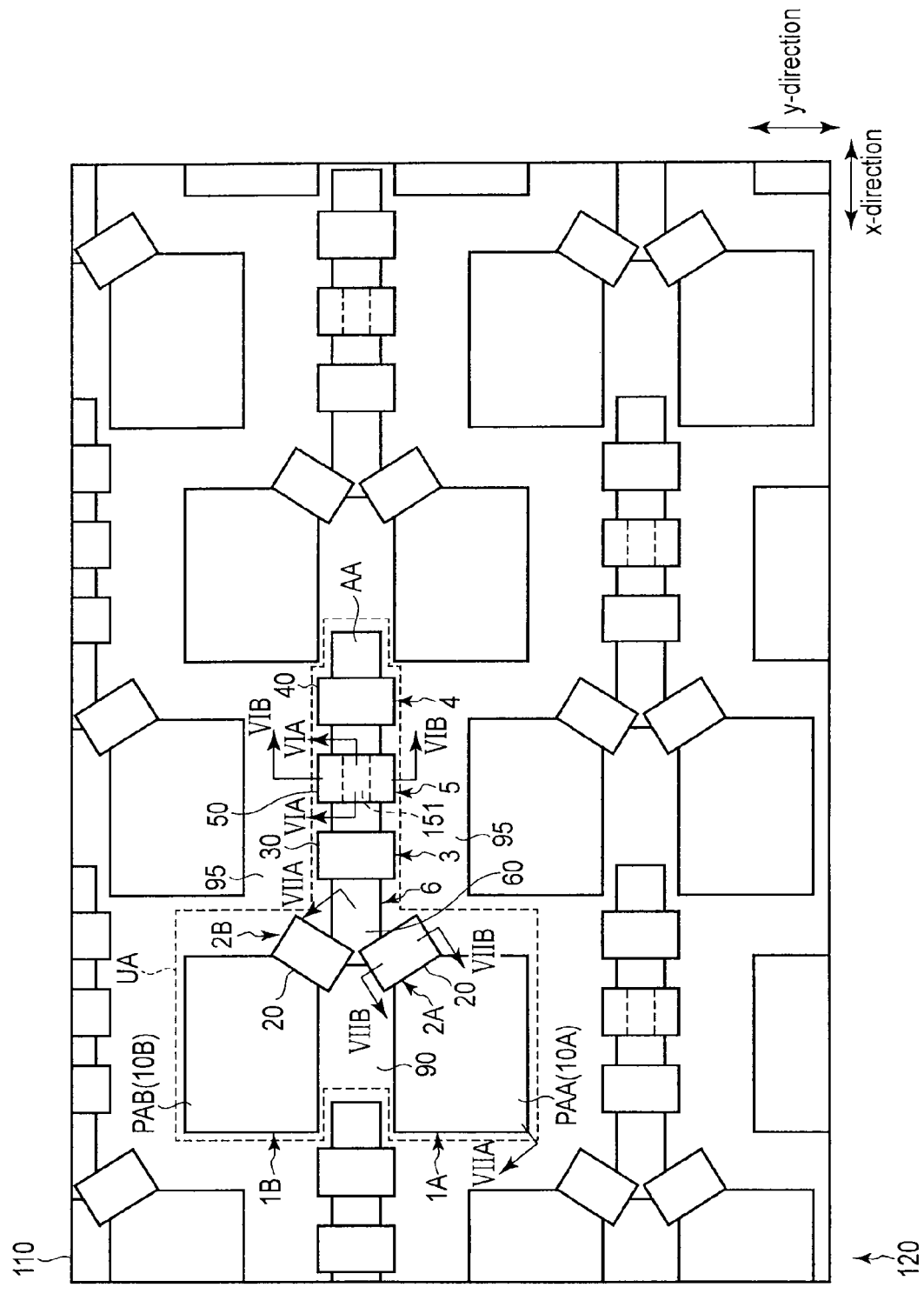
FIG. 4 is a plan view showing an example of the configuration of the pixel array in the solid-state imaging device according to the embodiment.

FIG. 4 is a view showing a planar configuration of the pixel array 120.

FIG. 4 shows a layout of the unit cells UC having the two-pixel one-cell structure in the pixel array 120.

As shown in FIG. 4, in a forming region of the unit cell UC, regions PAA and PAB where the two pixels 1A and 1B are formed and a region AA where the pixel control unit is formed are provided. The region UA where the unit cell UC is formed will be referred to as a unit cell forming region UA. The regions PAA and PAB where the pixels are formed will be referred to as pixel forming regions PAA and PAB. When the pixel forming regions PAA and PAB are not discriminated from each other, each of these regions will be written as a pixel forming region PA.

The region AA where the pixel control unit is formed will be referred to as a pixel control unit forming region AA.

The unit cell forming region UA is partitioned by element isolating regions 90 and 95 in accordance with each unit cell UC in the pixel array 120. The unit cell forming region UA is surrounded by the element isolating regions 90 and 95.

The pixel forming region PA and the pixel control unit forming region AA are semiconductor regions provided in the semiconductor substrate (the chip) 110. In one unit cell forming region UA, the two pixel forming regions PAA and PAB and the one pixel control unit forming region AA are semiconductor regions that are continuous in the semiconductor substrate 110. In one unit cell forming region UA, respective corners of the two pixel forming regions PAA and PAB that are adjacent to each other are connected to one end of the rectangular pixel control unit forming region AA in the longitudinal direction (the extending direction).

The pixel forming region PA has a rectangular (square) planar shape. The pixel control unit forming region AA has a linear (rectangular) planar shape.

The two pixel forming regions PAA and PAB in the single unit cell forming region are adjacent to each other in a y-direction to sandwich the element isolating region (the element isolating layer) 90. For example, the two pixel forming regions PAA and PAB in the single unit cell forming region UA are partitioned by an impurity semiconductor layer as the element isolating layer 90. However, the element isolating layer 90 formed of an insulator may partition the two pixel forming regions PAA and PAB in the unit cell forming region UA. For example, the pixel forming regions PA in the unit cell forming regions UA that are different from each other are electrically isolated by an insulator as the element isolating layer.

The two pixel forming regions PAA and PAB in the unit cell forming region UA have a layout that they are sandwiched between the pixel control unit forming regions AA in the two unit cell forming regions UA which are different from each other in the y-direction. The pixel forming regions PAA and PAB in the unit cell forming regions UA which are different from each other are aligned along an x-direction in such a manner that the regions PAA and PAB are staggered (form a zigzag pattern) in the y-direction. The pixel forming regions in the unit cell forming regions UA which are adjacent each other in an oblique direction with respect to an x-y plane are laid out between the two pixel forming regions in the two unit cell forming regions UA which are adjacent to each other in the x-direction.

The pixel control unit forming region AA is partitioned by the insulator as the element isolating layer 95.

In the unit cell forming regions UA aligned along the x-direction, the pixel control unit forming regions AA are laid out within the pixel array 120 in such a manner that the pixel control unit forming regions AA are aligned on the same straight line along the x-direction.

The pixel control unit forming regions AA are laid out in the pixel array 120 in such a manner that these regions AA are sandwiched between the two pixel forming regions PAA and PAB belonging to the different unit cell forming regions UA in the y-direction.

The other end of the pixel control unit forming region AA in the longitudinal direction is arranged between the two pixel forming regions PAA and PAB of another unit cell forming region UA that is adjacent in the x-direction.

As shown in FIG. 4, the gate electrode 20 of the transfer gate (the read transistor) 2 is provided on a connecting portion (a semiconductor region) of the pixel forming region PA and the pixel control unit forming region AA through the gate insulating film.

The gate electrode 20 of the transfer gate 2 is inclined with respect to the extending direction of the pixel control unit forming region AA. A channel length direction of the transfer gate 2 is inclined with respect to the extending direction of the pixel control unit forming region AA.

Based on the on/off state of the transfer gates 2A and 2B associated with the two pixels 1A and 1B, the pixel forming regions PAA and PAB formed of the continuous semiconductor region are electrically connected to or electrically disconnected from the pixel control unit forming region AA.

The pixel forming region PA includes an impurity semiconductor layer in which the photodiode 1 is formed. Each impurity semiconductor layer 10A or 10B in which the photodiode 1 is formed may be a single layer or may have a laminated structure formed of layers having different impurity concentrations.

For example, the impurity semiconductor layer for the photodiode 1 in the pixel forming region PA is used as one end (a source/drain region) of the current path of the transfer gate 2.

The impurity semiconductor layer 60 as the floating diffusion 6 is provided in the pixel control unit forming region AA. The floating diffusion 6 is laid out in the pixel control unit forming region AA to be surrounded by the gate electrodes 20 of the two transfer gates 2A and 2B and a gate electrode 30 of the reset transistor 3.

A contact plug (not shown) is provided above the impurity semiconductor layer 60.

The floating diffusion 6 is used as the other end (the source/drain region) of the current path of the transfer gate 2.

The gate electrode 30 of the reset transistor 3 is provided above the pixel control unit forming region AA through the gate insulating film. The channel length direction of the reset transistor 3 coincides with the extending direction (the longitudinal direction) of the pixel control unit forming region AA. One end and the other end of the gate electrode 30 of the reset transistor 3 in a channel width direction of the transistor are arranged above the element isolating region.

The floating diffusion 6 substantially serves as one end (the source/drain region) of the current path of the reset transistor 3. The other end of the current path of the reset transistor 3 is the impurity semiconductor layer provided in the pixel control unit forming region AA.

The address transistor 4 is arranged at an end portion of the pixel control unit forming region AA on the opposite side of the side (the one end) where the floating diffusion is provided in the longitudinal direction.

A gate electrode 40 of the address transistor 4 is provided above the pixel control unit forming region AA through the gate insulating film. The one end and the other end of the current path of the address transistor 4 correspond to the impurity semiconductor layer provided in the pixel control unit forming region AA. The impurity semiconductor layer as the other end of the current path of the address transistor 4 is provided at an end portion of the pixel control unit forming region AA in the extending direction (the opposite side of the side where the floating diffusion 6 is provided). The impurity semiconductor layer as the other end of the current path of the address transistor 4 is not shared by the other transistors. For example, a contact plug (not shown) is provided on the impurity semiconductor layer of the address transistor 4 which is not shared by the other transistors.

The amplification transistor 5 is laid out between the reset transistor 3 and the address transistor 4 in the pixel control unit forming region AA.

A gate electrode 50 of the amplification transistor 5 is provided above the pixel control unit forming region AA through the gate insulating film. The gate electrode 50 of the amplification transistor is provided between the gate electrode 30 of the reset transistor 3 and the gate electrode 40 of the address transistor 4.

The impurity semiconductor layer as one end of the current path of the amplification transistor 5 is shared by the impurity semiconductor layer as the other end of the current path of the reset transistor 3. The impurity semiconductor layer as the other end of the current path of the amplification transistor 5 is shared with the impurity semiconductor layer as one end of the current path of the address transistor 4.

The gate electrode 50 of the amplification transistor 5 is connected to the floating diffusion 6 through the interconnect and the plug.

The respective transistors 2, 3, 4, and 5 in the pixel control unit share the impurity semiconductor layer as the source/drain (the one end and the other end of the current path) between the transistors that are adjacent to each other. As a result, an area share ratio of the unit cell forming region UC is reduced, and the unit cell UC is shrunk.

It is to be noted that, as with the reset transistor 3, the channel length direction of each of the address transistor 4 and the amplification transistor 5 corresponds to the extending direction (the longitudinal direction) of the pixel control unit forming region AA. The channel width direction of each of the reset transistor 3, the address transistor 4, and the amplification transistor 5 corresponds to the width direction of the pixel control unit forming region AA. In the channel width direction of the transistor, the one end and the other end of each of the gate electrodes 40 and 50 of the address transistor 4 and the amplification transistor 5 are arranged above the element isolating region.

A cross-sectional configuration of the transistor included in the unit cell of the solid-state imaging device (the image sensor) according to this embodiment will now be described with reference to FIG. 5 to FIG. 7B.

FIG. 5 is a bird's eye view showing a configuration of the transistor in the unit cell UC in the solid-state imaging device according to this embodiment. FIG. 6A, FIG. 6B, FIG. 7A, and FIG. 7B are cross-sectional views showing the configuration of the transistor in the unit cell UC in the solid-state imaging device according to this embodiment. It is to be noted that, in FIG. 5 to FIG. 7B, the interlayer insulating film covering the gate electrode of the transistor in the unit cell is omitted to clarify the illustrations.

As shown in FIG. 5, in the image sensor 100 according to this embodiment, the gate electrode 50 of the transistor included in the unit cell UC has a portion 151 embedded in the semiconductor substrate 110. The portion 151 of the gate electrode 50 of the transistor 5 embedded in the semiconductor substrate will be referred to as an embedded portion 151. A portion other than the embedded portion 150 of the gate electrode 50 will be referred to as an upper layer portion 150. The upper layer portion 150 is a portion placed on the upper side (the interlayer insulating film side) of a position of an upper surface of the semiconductor substrate 110 (an upper surface of a source/drain region 52), and an upper part and a side part of the upper layer portion 150 are covered with the interlayer insulating film (not shown). The upper layer portion 150 of the gate electrode 50 protrudes toward the opposite side (the interlayer insulating film side) with respect to a bottom part of the semiconductor substrate away from the front surface (upper surface) of the semiconductor substrate 110. The upper layer portion 150 may be referred to as a protruding portion 150 in some cases.

When a part (the embedded portion) 151 of the gate electrode 50 is embedded in the semiconductor substrate 110, areas of the gate electrode 50 and the semiconductor substrate (the channel region) 110 facing each other through the gate insulating film 51 are increased. As a result, even if a planar size of the transistor (the gate electrode) is reduced, a dimension of the channel region (a channel length/channel width) of the transistor can be increased.

For example, the transistor 5 having the gate electrode 50 including the embedded portion 151 is the amplification transistor 5.

FIG. 6A and FIG. 6B are views showing a cross-sectional configuration of the amplification transistor 5 included in the image sensor 100 according to this embodiment.

FIG. 6A shows a cross section taken along VIA-VIA in FIG. 4 and also shows a cross-sectional configuration of the amplification transistor 5 along the channel length direction of the transistor. FIG. 6B shows a cross section taken along VIB-VIB in FIG. 4 and also shows a cross-sectional configuration of the amplification transistor 5 along the channel width direction of the transistor.

As shown in FIG. 5, FIG. 6A, and FIG. 6B, the embedded portion 151 of the gate electrode 50 of the amplification transistor 5 is provided in a trench RC1 formed in the semiconductor substrate 110.

The gate insulating film 51 of the amplification transistor 5 is provided along an inner surface and a bottom surface of trench RC1.

The embedded portion 151 of the gate electrode 50 protrudes toward the semiconductor substrate 120 side from the bottom surface of the upper layer portion (the protruding portion) 150 of the gate electrode 50. Since the embedded portion 151 is formed, a part of the bottom surface of the gate electrode 50 is retreated toward the bottom part side of the semiconductor substrate 110 away from the upper surface of the semiconductor substrate 110 (the upper surface of the source/drain region) in the vertical direction with respect to the semiconductor substrate surface.

As shown in FIG. 6A, the side surface of the embedded portion 151 in the channel length direction is adjacent to the impurity semiconductor layer 52 as the source/drain region to sandwich the gate insulating film 52. The cross-sectional shape of the gate electrode 50 in the channel length direction of the transistor is a substantially rectangular shape.

As shown in FIG. 6B, the gate insulating film 51 and the semiconductor region 110 are provided between each side surface of the embedded portion 151 and the element isolating layer 95 in the channel width direction. Both side surfaces of the embedded portion 151 in the channel width direction face the semiconductor region (the semiconductor substrate) 110 to sandwich the gate insulating film 51.

The cross-sectional shape of the gate electrode 50 in the channel width direction of the transistor is a downward-facing convex cross-sectional shape.

The gate insulating film 51 is provided between the semiconductor substrate 110 and the upper layer portion 150 and between the semiconductor substrate 110 and the side surfaces and the bottom surface of the embedded portion 151.

A dimension (a width) W1 of the embedded portion 151 in the channel width direction of the transistor is smaller than a width of the upper layer portion 152 in the channel width direction of the transistor. The width W1 of the embedded portion 151 is larger than a dimension that is double a film thickness of the gate insulating film 52. For example, a dimension L1 of the embedded portion 151 in the channel length direction of the transistor is substantially equal to a dimension L2 of the upper layer portion 150 in the channel length direction of the transistor.

It is preferable for the width W1 of the embedded portion 151 in the channel width direction of the transistor to be smaller than a width WAA of the pixel control unit forming region AA in the channel width direction of the transistor. That is because, when the width W1 of the embedded portion 151 is equal to the width WAA of the pixel control unit forming region AA, the element isolating layer 95 is in contact with the side surface of the embedded portion 151 and an area that the side surface of the embedded portion 151 in the channel width direction faces the semiconductor region 110 is reduced as compared with a configuration that the element isolating layer 95 is not in contact with the side surface of the embedded portion 151.

Therefore, it is preferable to set the dimensions of the embedded portion 151 and trench RC1 in which this portion is embedded in such a manner that the width W1 of the embedded portion 151 becomes smaller than the width WAA of the pixel control unit forming region AA.

In the vertical direction (the depth direction) with respect to the surface of the semiconductor substrate 110, the bottom surface of the embedded portion 151 of the gate electrode 50 is placed (retired) on the bottom part side of the semiconductor substrate 110 away from the upper surface of the source/drain region 52. For example, in the vertical direction (the depth direction) with respect to the surface of the semiconductor substrate 110, the bottom surface of the embedded portion 151 of the gate electrode 50 is placed to be closer to the bottom portion side of the semiconductor substrate 110 than the bottom surface of the element isolating layer 95. It is to be noted that a position of the bottom surface of the embedded portion 151 of the gate electrode 50 may be set at an intermediate position between a position of the upper surface of the source/drain region 52 and a position of the bottom surface of the element isolating layer 95.

For example, in the vertical direction (the depth direction) with respect to the surface of the semiconductor substrate 110, the embedded portion 151 of the gate electrode 50 has a dimension (a thickness) d1. Dimension d1 of the embedded portion 151 may be larger or smaller than a dimension of the upper layer portion 150 in the vertical direction with respect to the surface of the semiconductor substrate 110.

As with the image sensor 100 according to this embodiment, when the amplification transistor 5 has the portion 151 embedded in the semiconductor substrate 110, a dimension of the channel width (the gate width) of the amplification transistor 5 is substantially WAA+2×d1. As described above, the channel width of the transistor 5 is increased in accordance with dimension d1 that each side surface of the embedded portion 151 in the channel width direction faces the semiconductor region 110. That is, in the image sensor 100 according to this embodiment, when dimension d1 of the embedded portion 151 is increased, the channel width of the amplification transistor 5 can be increased as compared with the planar area (two-dimensional area) that the gate electrode 50 faces the semiconductor substrate 110 in the horizontal direction with respect to the semiconductor substrate surface.

Further, a channel length (a gate length) of the amplification transistor 5 is increased in accordance with dimension (the thickness) d1 when the gate electrode 50 has the embedded portion 151. For example, in a portion where the embedded portion 151 is provided, the channel length (the gate length) of the amplification transistor 5 is L2+2×d1.

As described above, when the gate electrode 50 of the transistor 5 has the portion 151 embedded in the semiconductor substrate 110, the area that the gate electrode 50 of the amplification transistor 5 faces that semiconductor region 110 can be increased, and the channel dimensions (the channel width and the channel length) of the transistor can be enlarged.

It is to be noted that, in the example shown in FIG. 5, FIG. 6A, and FIG. 6B, trench RC1 has the rectangular cross-sectional shape. However, trench RC1 may have a semicircular or semielliptic cross-sectional shape. In this case, the bottom part of trench RC1 has a predetermined curvature, and the bottom surfaces of trench RC1 and the embedded portion 151 of the gate electrode 50 are curved surfaces.

Figure 7A:
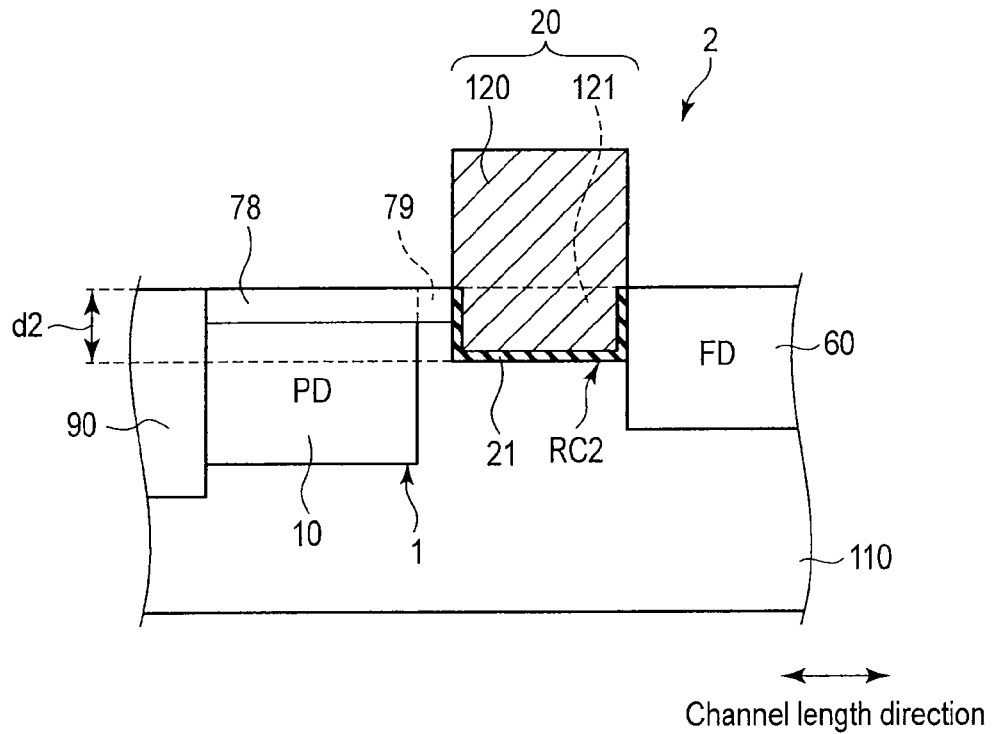
FIG. 7A is a cross-sectional view showing the configuration of the element in the unit cell in the solid-state imaging device according to the embodiment.
Figure 7B:
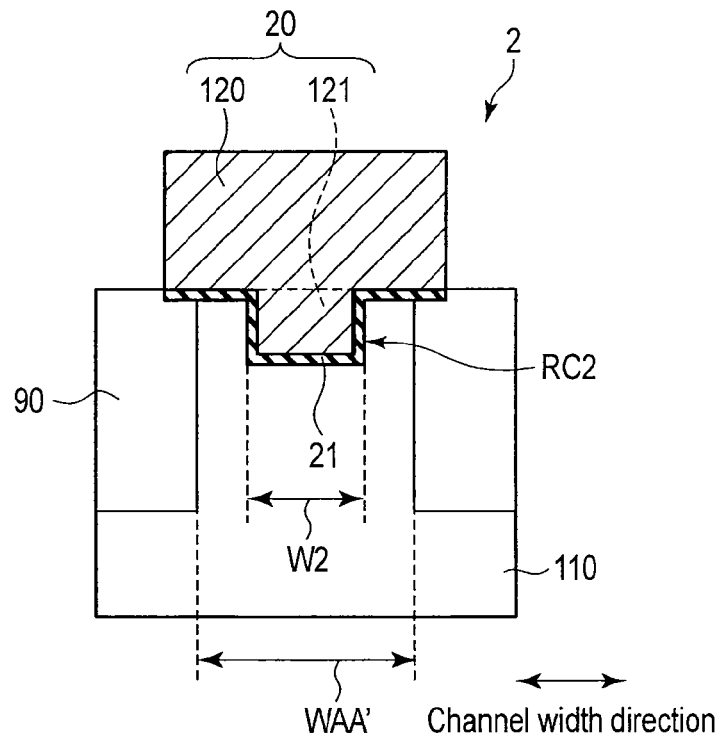
FIG. 7B is a cross-sectional view showing the configuration of the element in the unit cell in the solid-state imaging device according to the embodiment.

As shown in FIG. 7A and FIG. 7B, the transfer gate (the read transistor) 2 may have the gate electrode 20 including an embedded portion 121.

FIG. 7A shows a cross section taken along line VIIA-VIIA in FIG. 4 and also shows a cross-sectional configuration of the transfer gate 2 along the channel length direction of the transistor. FIG. 7B shows a cross section taken along line VIIB-VIIB in FIG. 4 and also shows the cross-sectional configuration of the transfer gate 2 along the channel width direction of the transistor.

As shown in FIG. 7A and FIG. 7B, as with the gate electrode 50 of the transistor (the amplification transistor 5) in the pixel control unit depicted in FIG. 6A and FIG. 6B, the transfer gate 2 has the gate electrode 20 including the upper layer portion (the protruding portion) 120 and the embedded portion 121.

The embedded portion 121 of the gate electrode 20 in the transfer gate 2 is provided in a trench RC2 formed in the semiconductor substrate 110. A gate insulating film 21 is provided between the semiconductor substrate 110 and the embedded portion 121.

As shown in FIG. 7A, one side surface of the embedded portion 121 in the channel length direction is adjacent to the impurity semiconductor layer 60 as the floating diffusion to sandwich the gate insulating film 21. The other side surface of the embedded portion 121 in the channel length direction is adjacent to the semiconductor region 110 and the surface shield layers 78 and 79 to sandwich the gate insulating film 21.

The semiconductor region is provided between the impurity semiconductor layer in which the photodiode 1 is to be formed and the gate insulating film 21 on the side surface of the embedded portion 121. However, the side surface of the impurity layer 10 of the photodiode may be in contact with the gate insulating film 21 on the side surface of the embedded portion 121.

For example, an impurity concentration of a portion 79 of the surface shield layer 78 adjacent to the embedded portion 121 is lower than an impurity concentration of the surface shield layer 78 on the surface layer of the impurity semiconductor layer 10 of the photodiode 1. The portion 79 of the surface shield layer 78 adjacent to the embedded portion 121 will be referred to as a low-concentration shield layer 79. The impurity semiconductor layer having the low concentration is formed, then a sidewall film (not shown) is formed on the side surface of the gate electrode 20, ion implantation is again performed, and the surface shield layer 78 having a high concentration is formed, whereby the low-concentration shield layer 79 is formed.

As shown in FIG. 7B, in the channel width direction of the transistor, a width W2 of the embedded portion of the gate electrode 20 of the transfer gate 2 is smaller than an interval WAA' between the element isolating layers 90 sandwiching the channel region of the transfer gate 2. Therefore, both side surfaces of the embedded portion 121 in the channel width direction face the semiconductor region 110 to sandwich the gate insulating film 21. It is to be noted that the element isolating layer 90 provided in the channel width direction of the transfer gate may be an insulator.

For example, in the vertical direction with respect to the surface of the semiconductor substrate 110, a position of the bottom surface of the impurity semiconductor layer 10 of the photodiode is set to be closer to the bottom part (back surface) side of the semiconductor substrate 110 than a position of the bottom surface of the embedded portion 121 of the gate electrode 20 of the transfer gate 2. In the vertical direction with respect to the surface of the semiconductor substrate 110, a position of the bottom surface of the impurity semiconductor layer 60 of the floating diffusion 6 is set at a position (a depth) between the position of the bottom surface of the impurity semiconductor substrate of the photodiode 1 and a position of the bottom surface of the embedded portion 121. For example, the position of the bottom surface of the element isolating layer (the impurity semiconductor layer) 90 that partitions the pixel forming region PA is set to be closer to the bottom part side of the semiconductor substrate 110 than the position of the bottom surface of the impurity semiconductor layer 10 of the photodiode 1.

When the gate electrode 20 of the transfer gate 2 includes the embedded portion 121, the position of the bottom surface of the gate electrode 20 of the transfer gate 2 becomes contiguous to the region with the high impurity concentration in the impurity semiconductor layer 10 of the photodiode 1 as the pixel (the center of a potential of the photodiode 1, or the center of the impurity concentration) in the vertical direction (the depth direction) with respect to the surface of the semiconductor substrate 110. For example, in the vertical direction with respect to the surface of the semiconductor substrate 110, it is preferable for the bottom surface of the gate electrode 20 of the transfer gate 2 to be arranged at substantially the same position (depth) as the position of the center of the impurity concentration (the position at which the impurity concentration becomes maximum) of the impurity semiconductor layer 10 of the photodiode 1.

Figure 8:
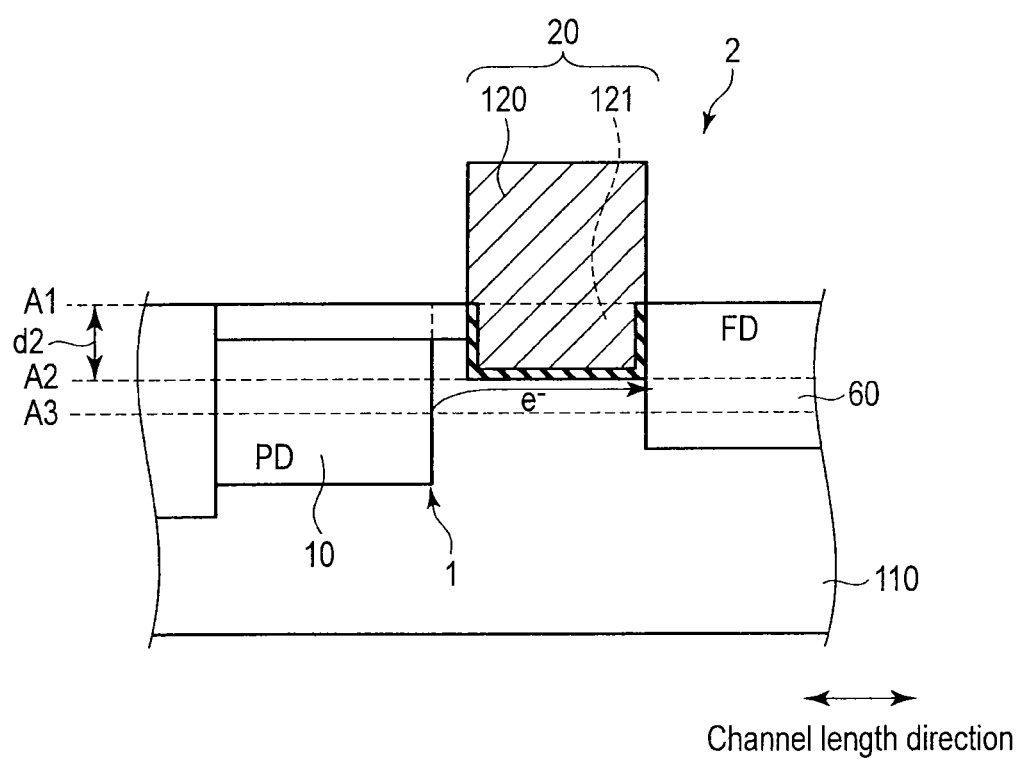
FIG. 8 is a view for explaining transfer of an electrical charge of a photoelectric conversion element in the solid-state imaging device according to the embodiment.

Consequently, as shown in FIG. 8, nearly all of the electrical charges stored in the photodiode 1 in association with light from a subject can be transferred to the floating diffusion 6.

FIG. 8 schematically shows a moving path of the signal charge when the electrical charge (the signal charge) stored in the photodiode 1 is transferred to the impurity semiconductor layer 60 as the floating diffusion 6 in the image sensor 100 according to this embodiment.

"A1" in FIG. 8 represents a position of the surface of the semiconductor substrate 110. "A2" in FIG. 8 denotes a position (a depth) of the embedded portion 121 of the gate electrode 20 of the transfer gate 2 in the vertical direction with respect to the semiconductor substrate surface. "A3" in FIG. 8 designates a position, at which the impurity concentration is maximum (the center of the impurity concentration), of the impurity semiconductor layer 10 of the photodiode 1 in the vertical direction with respect to the semiconductor substrate surface.

The bottom part of the embedded portion 121 of the gate electrode 20 of the transfer gate 2 is provided at the position A2 between the surface A1 of the semiconductor substrate 110 and the position A3 of the center of the impurity concentration of the photodiode 1 formed of the impurity semiconductor layer in the vertical direction with respect to the surface of the semiconductor substrate 110.

For example, "d2" representing a dimension between A1 and A2 corresponds to a dimension (a thickness) of the embedded portion 121 in the vertical direction with respect to the surface of the semiconductor substrate 110. It is to be noted that the thickness d1 of the embedded portion 151 of the amplification transistor 5 may be equal to or different from the thickness d2 of the embedded portion 121 of the transfer gate 2.

The signal charge from the photodiode 1 moves to the floating diffusion 6 through the channel formed on the bottom surface of the gate electrode 20 of the transfer gate 2.

In the image sensor 100 according to this embodiment, the gate electrode 20 of the transfer gate 2 includes the embedded portion 121, and the bottom surface of the gate electrode 20 protrudes toward the bottom part side of the semiconductor substrate 110 away from the surface A1 of the semiconductor substrate 110.

Therefore, in the vertical direction with respect to the surface of the semiconductor substrate 110, as compared with a configuration where the bottom surface of the gate electrode is arranged at substantially the same position as the surface A1 of the semiconductor substrate 110 (a configuration where the gate electrode does not have the embedded portion) like a transistor having a planar structure, the bottom surface of the gate electrode 20 including the embedded portion 121 is arranged near the center A3 of the impurity (the center of the potential) of the photodiode 1. Moreover, a distance between the center A3 of the impurity concentration of the photodiode 1 and the channel (the bottom surface of the gate electrode 20) A2 of the transfer gate 2 is reduced.

Therefore, as compared with a situation where the signal charge moves from the center A3 of the impurity concentration of the photodiode 1 toward the surface A1 of the semiconductor substrate 110, transfer of the electrical charge from the photodiode 1 to the floating diffusion 6 is facilitated. As a result, the signal charges stored in the photodiode 1 are substantially completely transferred to the floating diffusion 6.

As shown in FIG. 5 to FIG. 7B, in the image sensor 100 according to this embodiment, the field-effect transistor 2 or 5 in the unit cell UC has the gate electrode 20 or 50 including the portion (the embedded portion) 121 or 151 embedded in trench RC1 or RC2 of the semiconductor substrate 110.

For example, the amplification transistor 5 that amplifies a potential of the floating diffusion 60 has the gate electrode 50 including the embedded portion 151.

The embedded portion 151 of the gate electrode 50 of the amplification transistor 5 protrudes toward the bottom part side (the back surface side of the semiconductor substrate 110) of the semiconductor substrate 110 from the bottom surface of the upper layer portion (the protruding portion) 150 of the gate electrode 50. The side surface of the embedded portion 50 in the channel width direction faces the semiconductor region 110 through the gate insulating film 51.

As a result, the channel width of the amplification transistor 5 becomes larger than the width of the transistor forming region (the pixel control unit region), and an effective channel width of the amplification transistor 5 is increased. For example, the channel length of the amplification transistor 5 is also increased by the embedded portion 151 of the gate electrode 50 of the amplification transistor 5.

As described above, even if a planar size of the transistor is miniaturized, an area that the gate electrode faces the semiconductor region in the horizontal direction with respect to the surface of the semiconductor substrate can be assured between the side surface of the embedded portion 151 of the gate electrode 50 of the transistor 5 and the semiconductor region (the channel region).

In the image sensor 100 according to this embodiment, the area that the gate electrode 50 of the transistor in the unit cell UC faces the semiconductor region 110 can be increased, and the channel region of the transistor can be enlarged. As a result, according to the image sensor 100 of this embodiment, with shrinking of the field-effect transistor in the unit cell UC, it is possible to suppress deterioration of noise caused by the transistor 5, such as 1/f noise (flicker noise). According to the image sensor 100 of this embodiment, noise can be reduced by an increase in area of the channel region of the transistor in the unit cell UC that controls an operation of the pixel.

Therefore, a signal from the pixel (the unit cell) that is output from the vertical signal line VSL through the channel region of the amplification transistor 5 can be prevented from including noise of the transistor.

Further, since the channel width of the field-effect transistor can be broadened, current driving force of the transistor can be increased. Since the channel length of the field-effect transistor can be increased, a leakage current of the transistor can be reduced.

For example, as with the amplification transistor 5 to amplify a signal from the pixel, it is preferable to use the transistor having the gate electrode including the embedded portion for a transistor in the unit cell that operation characteristics of the transistor may possibly affect a signal from the pixel, i.e., a picture quality of an image.

Therefore, according to the image sensor 100 of this embodiment, the picture quality of an image formed by the image sensor can be improved.

Furthermore, in the image sensor 100 according to this embodiment, the transfer gate 2 to transfer the electrical charges in the photodiode has the gate electrode including the embedded portion 121.

As a result, in the vertical direction with respect to the semiconductor substrate surface, a position of the bottom surface of the gate electrode 20 of the transfer gate 2 is arranged near the region of the center (the center of the potential) of the impurity concentration of the photodiode 1.

Accordingly, the transfer path for the signal charges from the photodiode 1 to the floating diffusion 6 can be formed near the center of the impurity concentration of the photodiode 1, and nearly all of the signal charges stored in the photodiode 1 can be relatively easily transferred to the floating diffusion FD.

As a result, the image sensor 100 according to this embodiment can suppress an afterimage produced in the image when the signal charges remain in the photodiode 1.

For example, areas of the transistor and the transistor forming regions in the unit cell UC are miniaturized in accordance with miniaturization of a pixel size, and a planar size of the transistor is reduced. As with this embodiment, a part of the gate electrode 20 or 50 is embedded in the semiconductor substrate 110, the area that the gate electrode faces the semiconductor region is three-dimensionally assured, and an effective channel dimension of the transistor is increased. As a result, deterioration in operation characteristics of the transistor due to miniaturization of the unit cell (the pixel) can be suppressed.

In this embodiment, the description has been given as to the example where the gate electrodes 20 and 50 of both the amplification transistor 5 and the transfer gate 2 have the embedded portions 151 and 121. However, in the image sensor 100 according to this embodiment, the amplification transistor 5 alone may have the gate electrode 50 including the embedded portion 151. Further, in the image sensor 100 according to this embodiment, the transfer gate 2 alone may have the gate electrode 20 including the embedded portion 121. Furthermore, each of the reset transistor 3 and the address transistor 4 may have the gate electrode including the embedded portion.

It is to be noted that an example of the front-side illumination type image sensor has been explained, but the image sensor according to this embodiment may be applied to a back-side illumination type image sensor. That is, in a unit cell UC of the back-side illumination type image sensor, at least one of a transfer gate 2 and an amplification transistor 5 has the configuration shown in FIG. 5 to FIG. 7B. In the back-side illumination type image sensor, a back surface of a semiconductor substrate 110 serves as a light receiving surface for light from a subject. In the back-side illumination type image sensor, color filters and microlenses are provided on a back surface side of the semiconductor substrate. In the back-side illumination type image sensor in which field-effect transistors having gate electrodes 20 and 50 including embedded portions 121 and 151 are provided in a unit cell UC, substantially the same effect can be obtained as in the case of the front-side illumination type image sensor.

As described above, according to the solid-state imaging device of this embodiment, the picture quality of an image formed by the image sensor can be improved.

(b) Manufacturing Method

A manufacturing method of a solid-state imaging device (for example, an image sensor) according to the first embodiment will now be described with reference to FIG. 5 to FIG. 10B.

Figure 9A:
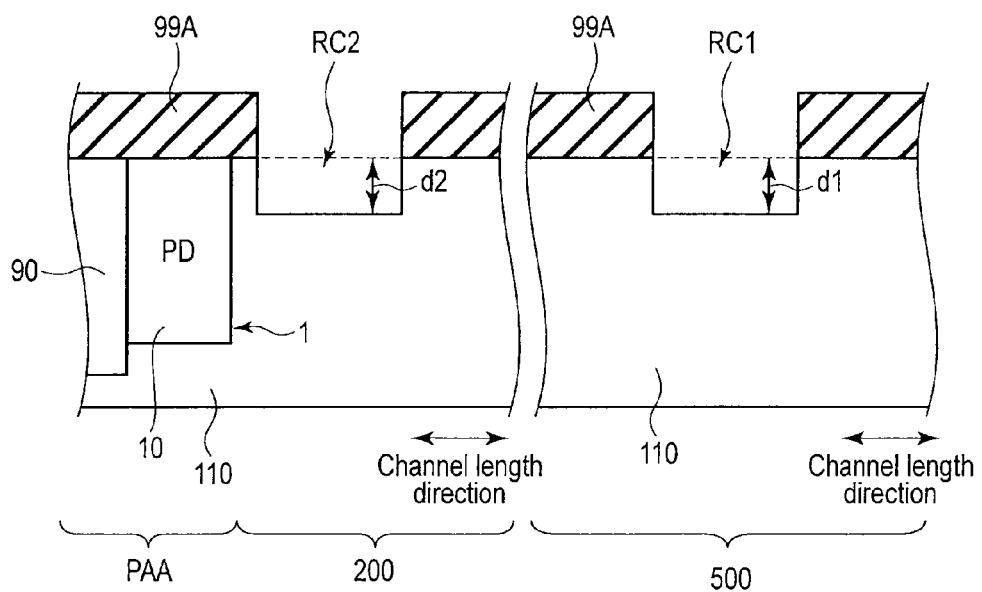
FIG. 9A is cross-sectional process chart showing a step in a manufacturing method of the solid-state imaging device according to the embodiment.
Figure 9B:
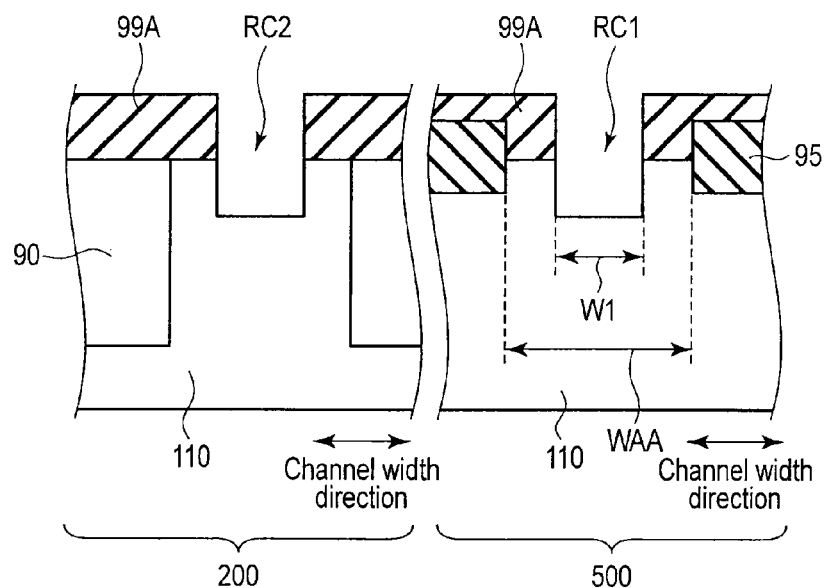
FIG. 9B is a cross-sectional process chart showing a step in the manufacturing method of the solid-state imaging device according to the embodiment.

Each of FIG. 9A and FIG. 9B is a cross-sectional process chart showing one step in the manufacturing method of the image sensor according to the first embodiment. FIG. 9A is a cross-sectional process chart of a region 200 where the transfer gate is formed and a region 500 where the amplification transistor is formed along the channel length direction of the transistor. FIG. 9B is a cross-sectional process chart of the region 200 where the transfer gate is formed and the region 500 where the amplification transistor is formed along the channel width direction of the transistor. In the following description, the region 200 where the transfer gate is formed will be referred to as a transfer gate forming region 200 and the region 500 where the amplification transistor is formed will be referred to as an amplification transistor forming region 500.

As shown in FIG. 9A and FIG. 9B, the element isolating layers 90 and 95 are formed in the semiconductor substrate 110, and the pixel forming region PAA and the pixel control unit forming region AA in the unit cell forming region UC are partitioned. For example, to partition the pixel forming region PAA, the impurity semiconductor layer 90 as the element isolating layer 90 is formed in the semiconductor substrate 110. Furthermore, to partition the pixel control unit forming region AA, an insulator as the element isolating layer 95 is formed in the semiconductor substrate 110.

A patterned mask (for example, a resist mask) is formed on the semiconductor substrate 110 by the photolithography technology and etching. This mask (not shown) has an opening portion in the pixel forming region PAA. In a state that this mask covers regions other than the pixel forming region PAA, ion implantation for forming constituent members 10 of the photodiode is performed. As a result, the photodiode 1 is formed in the pixel forming region PAA of the semiconductor substrate 110.

After the mask for forming the photodiode 1 is removed, a mask 99A is formed on the semiconductor substrate 110. The mask 99A is patterned to form opening portions at positions of the gate electrodes of the transfer gate and the amplification transistor. Based on the mask 99A having the opening portions, the semiconductor substrate 110 is etched using, for example, reactive ion etching (RIE). As a result, in the transfer gate forming region 200 and the amplification transistor forming region 500, trenches RC1 and RC2 are substantially simultaneously formed at positions where the gate electrodes of the field-effect transistors are formed in the semiconductor substrate 110.

In the amplification transistor forming region 500, the opening portion is formed in the mask 99A in such a manner that the width W1 of the formed trench RC1 becomes smaller than the width WAA of the amplification transistor forming region (the pixel control unit forming region) 500. Therefore, in the channel width direction of the transistor, the semiconductor region (the semiconductor substrate) 110 remains in a region covered with the mask 99A between trench RC1 and the element isolating layer 95. The width W1 of trench RC1 is set to a dimension that is twofold or above of a film thickness of the gate insulating film of the transistor that is formed at a later step.

In the transfer gate forming region 200, it is preferable for a dimension (a depth) d2 of trench RC2 in the vertical direction with respect to the surface of the semiconductor substrate 110 to be set at a position near the center of the impurity concentration (a position at which the impurity concentration is maximum) of the photodiode 1 in the vertical direction with respect to the surface of the semiconductor substrate 110. For example, a depth (a position of the bottom surface of trench RC1) d1 of trench RC1 in the amplification transistor forming region 500 is set to a dimension that the bottom surface of trench RC1 is placed on the bottom part side of the semiconductor substrate 110 away from the bottom surface of the element isolating layer 95.

If trench RC2 in the transfer gate forming region 200 and trench RC1 in the amplification transistor forming region 500 are formed at a common step, depth d1 of trench RC1 in the amplification transistor forming region 500 is set to be substantially equal to depth d2 of trench RC2 in the transfer gate forming region 200. However, depth d1 of trench RC1 in the amplification transistor forming region 500 may be different from depth d2 of trench RC2 in the transfer gate forming region 200. If depths d1 and d2 of trenches RC1 and RC2 are different from each other, trenches RC1 and RC2 are formed at different steps.

For example, in the reset transistor forming region and the address transistor forming region, the opening portion is not formed in the mask 99A. The regions where the reset transistor and the address transistor are formed are covered with the mask 99A at the timing of etching for forming trenches RC1 and RC2. Therefore, in the regions where the reset transistor and the address transistor are formed, no trench is formed in the semiconductor substrate 110.

Figure 10A:
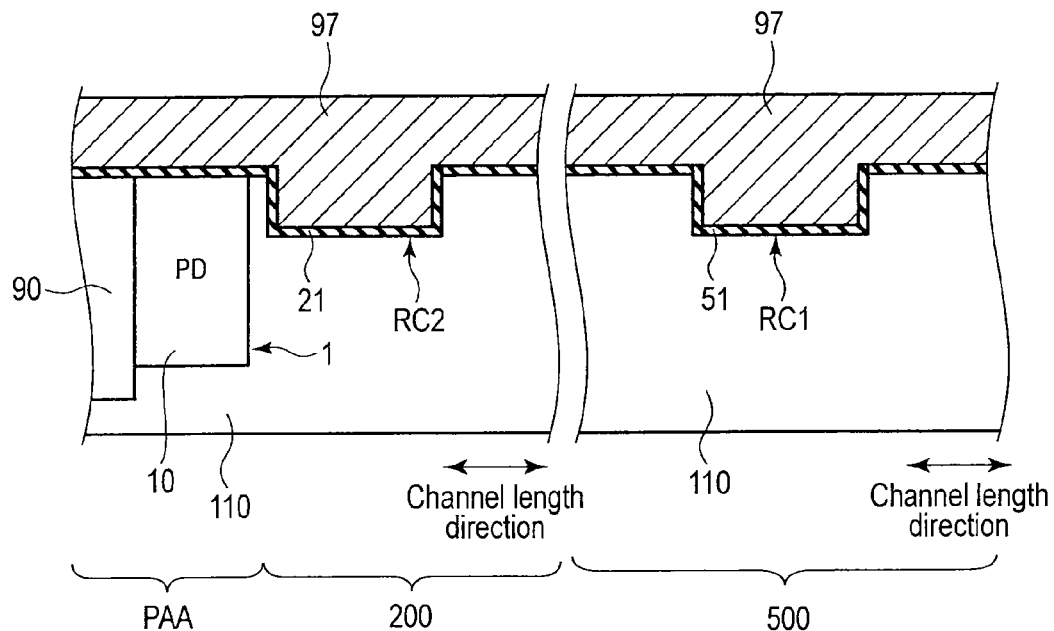
FIG. 10A is a cross-sectional process chart showing a step in the manufacturing method of the solid-state imaging device according to the embodiment.
Figure 10B:
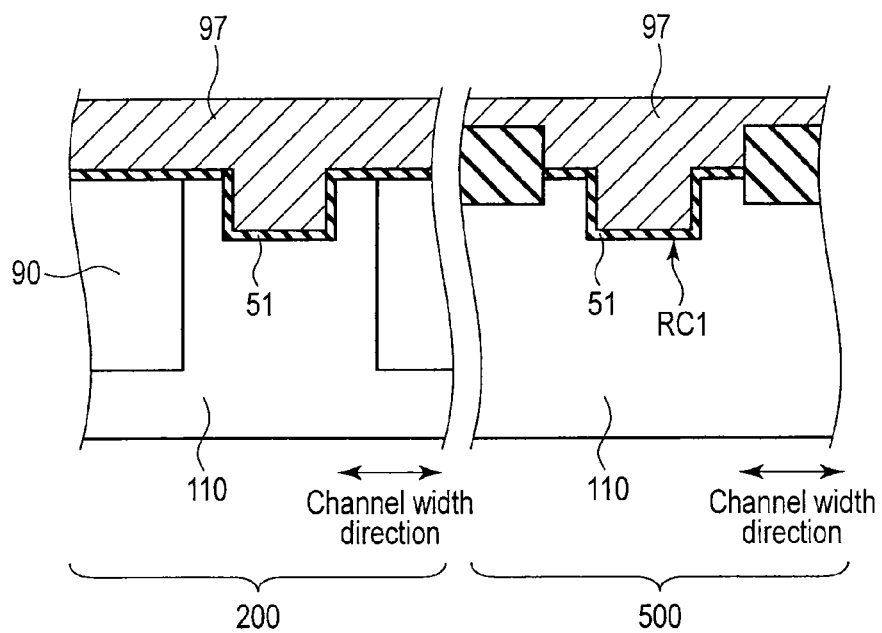
FIG. 10B is a cross-sectional process chart showing a step in the manufacturing method of the solid-state imaging device according to the embodiment.

Each of FIG. 10A and FIG. 10B is a cross-sectional process chart showing one step in the manufacturing method of the image sensor according to the first embodiment. FIG. 10A is a cross-sectional process chart of the transfer gate forming region 200 and the amplification transistor forming region 500 along the channel length direction of the transistor. FIG. 10B is a cross-sectional process chart of the transfer gate forming region 200 and the amplification transistor forming region 500 along the channel width direction of the transistor.

As shown in FIG. 10A and FIG. 10B, after the mask for forming trenches RC1 and RC2 are removed, the gate insulating films 21 and 51 of the transistors are formed on the semiconductor substrate 110 by, for example, a thermal oxidation method. As a result, the gate insulating films 21 and 51 are formed on the exposed surface of the semiconductor substrate 110 and in trenches RC1 and RC2.

Each of the dimensions of trenches RC1 and RC2 in the channel width direction and the channel length direction of the transistor is set to a dimension which is twofold or above of the film thickness of each of the gate insulating films 21 and 51. Therefore, no trenches RC1 and RC2 are filled with the gate insulating films 21 and 51.

On the semiconductor substrate 110 and the gate insulating films 21 and 51, a conductor (for example, a conductive polysilicon layer) 97 is deposited by, for example, a chemical vapor deposition (CVD) method. The conductor 97 is embedded in trenches RC1 and RC2.

On the conductor 97, a mask (not shown) associated with a predetermined gate electrode pattern is formed by the photolithography technology and etching. Based on the patterned mask, the conductor 97 is processed by, for example, the RIE method.

Consequently, as shown in FIG. 6A to FIG. 7B, the gate electrodes 20 and 50 of the transfer gate 2 and the amplification transistor 5 are formed on the gate insulating films 21 and 51. In the manufacturing method of the image sensor 100 according to this embodiment, the formed gate electrodes 20 and 50 have the embedded portions 121 and 151 formed in trenches RC1 and RC2 of the semiconductor substrate 110 and the upper layer portions 120 and 150 on the upper side (the opposite side of the bottom part side of the semiconductor substrate 110) of the embedded portions 121 and 151, respectively. The side surfaces of the embedded portions 121 and 151 of the formed gate electrodes 20 and 50 face the semiconductor region to sandwich the gate insulating films 21 and 51.

It is to be noted that the gate insulating films and the gate electrodes of the field-effect transistors as the reset transistor, the address transistor, and the peripheral circuits are formed simultaneously with formation of the gate insulating films 21 and 52 and the gate electrodes 20 and 50 of the transfer gate 2 and the amplification transistor 5.

The formed gate electrode 50 is used as a mask, and the impurity semiconductor layer 52 as the source/drain region of the transistor 50 is formed in the semiconductor substrate 110 by, for example, the ion implantation method. Furthermore, the impurity semiconductor layer 60 as the floating diffusion 6 and the surface shield layer 78, 79 on the upper surface of the photodiode 1 are sequentially formed. For example, formation of the sidewall insulating film associated with the gate electrode and silicide processing for forming a silicide layer on the gate electrode are executed.

Moreover, as shown in FIG. 2, the interlayer insulating film 75, the metal layers 70 as the light shielding films or the interconnects, and the plugs 72 connecting the interconnects are formed by the multilayer interconnect technology.

Additionally, the color filters CF and the microlenses ML are formed on the interlayer insulating film 75 in association with the position of the photodiode 1. The pad is formed on the interlayer insulating film 75 or the back surface of the semiconductor substrate 110.

With the above-described steps, the image sensor 100 according to this embodiment is brought to completion.

In the manufacturing method of the image sensor according to this embodiment, the description has been given as to the example that trenches RC1 and RC2 are formed in both the transfer gate forming region 200 and the amplification transistor forming region 500 and the field-effect transistors 2 and 5 having the gate electrodes including the embedded portions 121 and 151 are formed. However, trenches RC1 or RC2 in which parts 121 or 151 of the gate electrodes 20 or 50 are embedded are formed in the transfer gate forming region 200 alone or in the amplification transistor forming region 500 alone, and the embedded portion 121 or 151 may be formed in the gate electrode 20 or 50 of either the transfer gate 2 or the amplification transistor 5.

Furthermore, in each of the regions where the reset transistor and the address transistor are formed, as with the transfer gate forming region 200 and the amplification transistor forming region 500, a trench in which a part of the gate electrode is embedded may be formed, and a field-effect transistor having the gate electrode including the embedded portion may be formed.

Moreover, an order of forming the constituent members, i.e., the field-effect transistors, the photodiode, and the floating diffusion is not restricted to the above-described order as long as consistency is assured. For example, after the transistors in the unit cell UC are formed, the photodiode may be formed.

As described above, in the manufacturing method of the image sensor according to this embodiment, the conductor is embedded in trenches RC1 and RC2 formed in the semiconductor substrate 110, and the conductor is processed into a predetermined gate pattern. This process results in formation of the unit cell UC including the transistors having the gate electrodes 20 and 50 including the portions 121 and 151 embedded in the semiconductor substrate 110 and the photodiode 1.

In the manufacturing method of the image sensor according to this embodiment, the amplification transistor 5 having the gate electrode including the embedded portion 151 is formed. In the gate electrode 50 of the formed amplification transistor 5, the bottom surface of the upper layer portion 150, the bottom surface of the embedded portion 151, and the side surface of the embedded portion 151 face the semiconductor region (the semiconductor substrate) 110.

As a result, in the image sensor 100 according to this embodiment, the effective dimension of the channel region of each transistor in the unit cell UC that controls the operation of the photodiode 1 can be increased. As a result, an increase in nose (for example, 1/f noise) of each transistor involved by miniaturization of the element can be suppressed. Therefore, the image sensor 100 according to this embodiment can reduce noise included in an image.

Additionally, in the manufacturing method of the image sensor according to this embodiment, the transfer gate 2 having the gate electrode including the embedded portion 121 is formed. When the gate electrode 20 of the formed transfer gate 2 has the embedded portion 121, the position of the bottom surface of the gate electrode 20 becomes close to the position of the center of the impurity concentration of the photodiode 1.

As a result, a moving length of the signal charge between the center of the impurity concentration of the photodiode 1 and the floating diffusion 6 becomes shorter than that in case of moving the signal charge to a position near the surface of the semiconductor substrate 110. Consequently, almost all of the signal charges stored in the photodiode 1 can be relatively easily transferred to the impurity semiconductor layer 60 as the floating diffusion. Therefore, the image sensor formed by the manufacturing method according to this embodiment can suppress an afterimage from being produced in an image to be formed.

As described above, according to the manufacturing method of the image sensor according to this embodiment, the image sensor that can improve the picture quality can be provided.

(2) Modification

A modification of the solid-state imaging device (for example, an image sensor) according to this embodiment will now be described with reference to FIG. 11A to FIG. 15.

A configuration of the field-effect transistor (for example, the amplification transistor) in the unit cell UC is not restricted to the above example (for example, FIG. 6A, FIG. 6B, FIG. 7A, and FIG. 7B) as long as the transistor has the gate electrode 50 including the upper layer portion and the embedded portion.

FIG. 11A to FIG. 13 are views showing a modification of the amplification transistor 5 included in the unit cell UC of the image sensor 100 according to this embodiment.

Figure 11A:
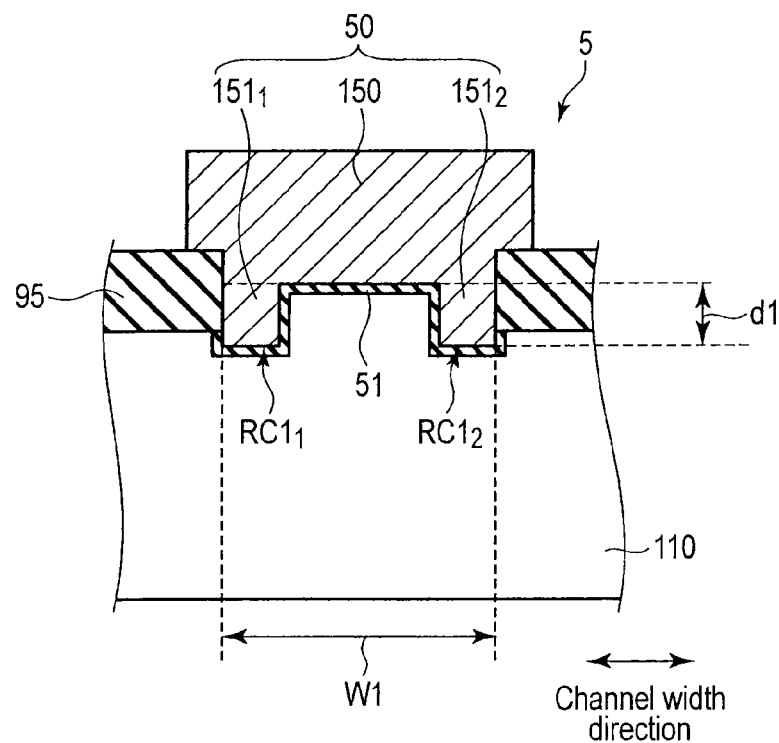
FIG. 11A is a view showing a modification of the solid-state imaging device according to the embodiment.

FIG. 11A shows a cross-sectional configuration of the amplification transistor 5 in the channel width direction.

As shown in FIG. 11A, a cross-sectional shape of the gate electrode 50 of the transistor in the unit cell UC may be a downward-facing concave (U-like) cross-sectional shape. For example, at one end and the other end in the channel width direction of the transistor, embedded portions $151_1$ and $151_2$ are provided in the gate electrode 50.

One side surface of one embedded portion $151_1$ of the two embedded portions $151_1$ and $151_2$ is in contact with the side surface of the element isolating layer 95, and one side surface of the other embedded portion $151_2$ of the same is in contact with the side surface of the element isolating layer 95. The semiconductor region (the semiconductor substrate) 110 is provided between side surfaces of the two embedded portions $151_1$ and $151_2$ which are not in contact with the element isolating layer 95.

In the cross section along the channel width direction, a channel width of the amplification transistor 5 that has the gate electrode 50 having the downward-facing concave cross-sectional shape is WAA+2×d1.

Figure 11B:
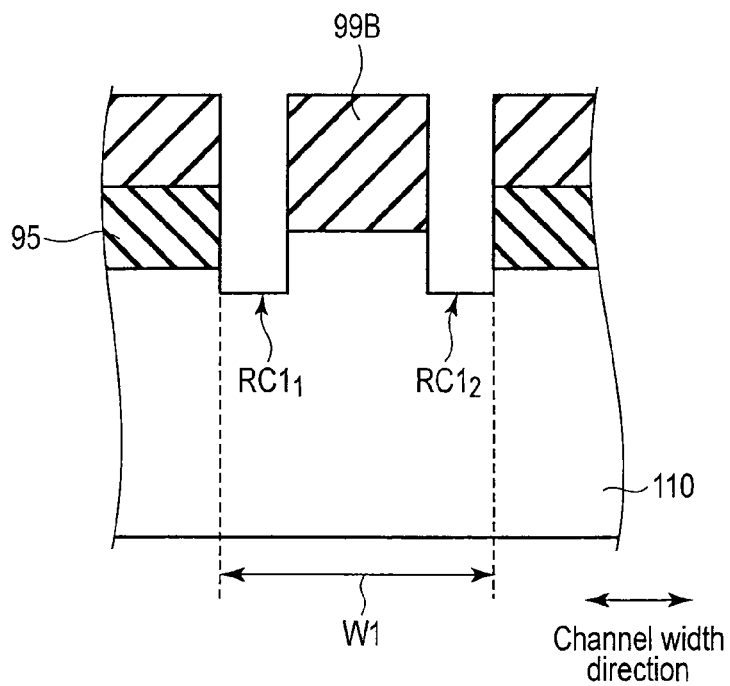
FIG. 11B is a view showing a modification of the solid-state imaging device according to the embodiment.

FIG. 11B is a view showing an example of the manufacturing method of the amplification transistor 5 depicted in FIG. 11A.

For example, as shown in FIG. 11B, in the manufacturing process of the image sensor shown in FIG. 9A and FIG. 9B, opening portions are formed in the mask 99B in such a manner that side surfaces of the element isolating layer 95 in the amplification transistor forming region in the channel width direction are exposed. As a result, the amplification transistor 5 that has the gate electrode 50 having the concave cross-sectional shape in the channel width direction can be formed.

It is to be noted that, in the cross section of the transistor in the channel length direction, the gate electrode 50 may have a downward-facing concave cross-sectional shape.

In regard to the amplification transistor 5 depicted in FIG. 6A and FIG. 6B, there is shown an example that the gate electrode 50 of the amplification transistor 5 has one embedded portion 151.

Figure 12:
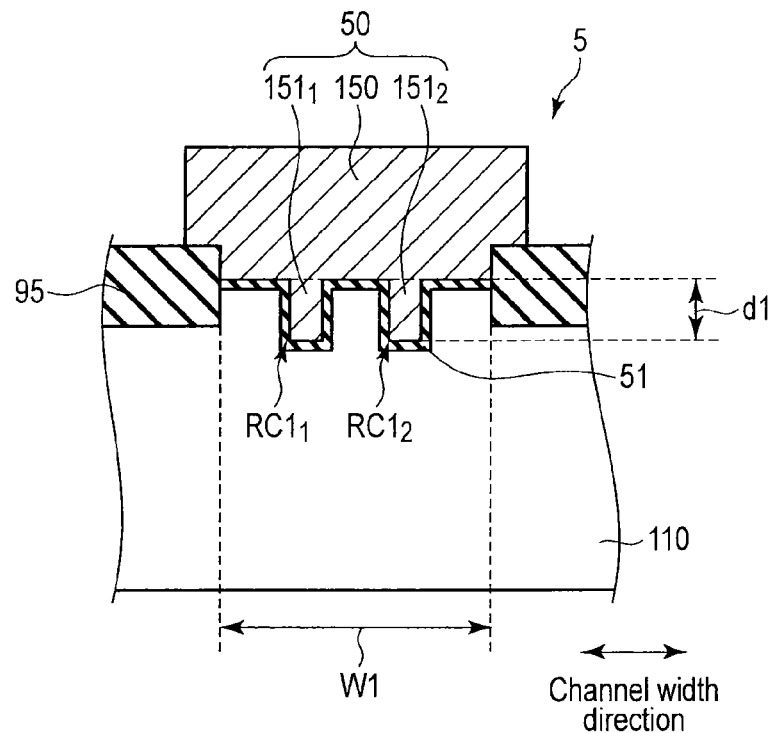
FIG. 12 is a view showing a modification of the solid-state imaging device according to the embodiment.

As shown in FIG. 12, two or more embedded portions $151_1$ and $151_2$ may be provided to the gate electrode 50. For example, the embedded portions $151_1$ and $151_2$ are extended in the channel length direction of the transistor.

FIG. 12 shows a cross-sectional configuration of the amplification transistor 5 in the channel width direction in a modification different from that shown in FIG. 11A and FIG. 11B.

As shown in FIG. 12, when the two embedded portions $151_1$ and $151_2$ are provided to the gate electrode 50, both side surfaces of the two embedded portions $151_1$ and $151_2$ of the transistor in the channel width direction face the semiconductor region 110 to sandwich the gate insulating film 51.

In this case, the channel width of the amplification transistor 5 having the gate electrode 50 that includes the two embedded portions $151_1$ and $151_2$ is WAA+4×d1.

In the configuration shown in FIG. 12, in the manufacturing process of the image sensor depicted in FIG. 9A, FIG. 9B, FIG. 11A, and FIG. 11B, the opening portions are formed in the mask 99 that covers the amplification transistor forming region 500 to prevent the side surfaces of the element isolating layer 95 in the amplification transistor forming region in the channel width direction in the amplification transistor forming region 500 from being exposed.

In this manner, when the embedded portions $151_1$ and $151_2$ are provided in the gate electrode 50 in such a manner that they are connected to the upper layer portion 150 of the gate electrode 50 of the transistor 50, the area that the gate electrode 50 faces the semiconductor region 110 can be further increased.

It is to be noted that the two embedded portions $151_1$ and $151_2$ are provided in the gate electrode 50 in the example shown in FIG. 12, but three or more embedded portions may be provided in the gate electrode 50.

A configuration of the amplification transistor 5 according to a modification different from those in FIG. 11A, FIG. 11B, and FIG. 12 will now be described with reference to FIG. 13.

Figure 13:
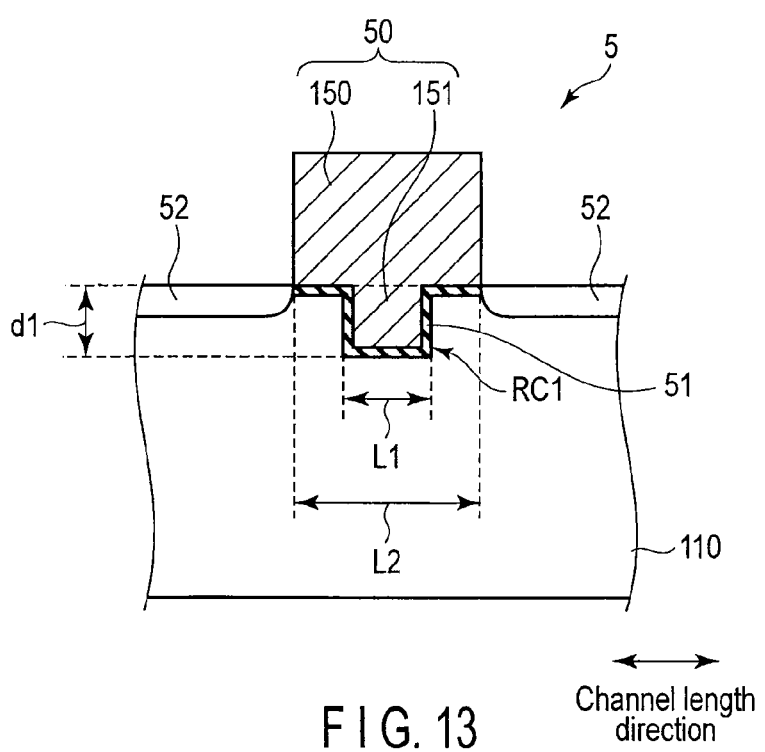
FIG. 13 is a view showing a modification of the solid-state imaging device according the embodiment.

FIG. 13 shows a cross-sectional configuration of the amplification transistor 5 in the channel length direction.

As shown in FIG. 13, in the cross-sectional shape of the gate electrode 50 of the amplification transistor 5 in the channel length direction, the semiconductor region (the semiconductor substrate) 110 may be provided between the gate insulating film 51 on the side surface of the embedded portion 151 and the impurity semiconductor layer 52 as the source/drain region. In this case, the cross-sectional shape of the gate electrode 20 in the channel length direction is a downward-facing convex cross-sectional shape. When the cross-sectional shape in the channel length direction has the configuration shown in FIG. 13 and the cross-sectional shape in the channel width direction has the configuration depicted in FIG. 6B, the planar shape of the embedded portion is a cross-like planar shape.

In the amplification transistor depicted in FIG. 13, dimension L1 of the embedded portion 151 of the gate electrode 50 in the channel length direction of the transistor is smaller than dimension L2 of the upper layer portion 150 of the gate electrode 50. For example, the dimension of trench RC1 in the channel length direction is larger than a dimension that is double a film thickness of the gate insulating film 52.

In the amplification transistor 5 depicted in FIG. 13, the channel length of the transistor 5 is represented as L2+2×d1. That is, the channel length of the amplification transistor is increased in accordance with the dimension that is double dimension d1 of the embedded portion in the depth direction. When the channel length of the transistor is increased, a leakage current when the transistor 5 is off can be reduced.

It is to be noted that, in the cross section of the transistor in the channel length direction, the amplification transistor 5 may be formed so that the gate electrode 50 can include embedded portions. In this case, the embedded portions are extended in the channel width direction of the transistor, and the channel length of the amplification transistor 5 is increased. For example, each of the transfer gate, the reset transistor, and the address transistor may have the gate electrodes shown in FIG. 11A to FIG. 13.

Figure 14A:
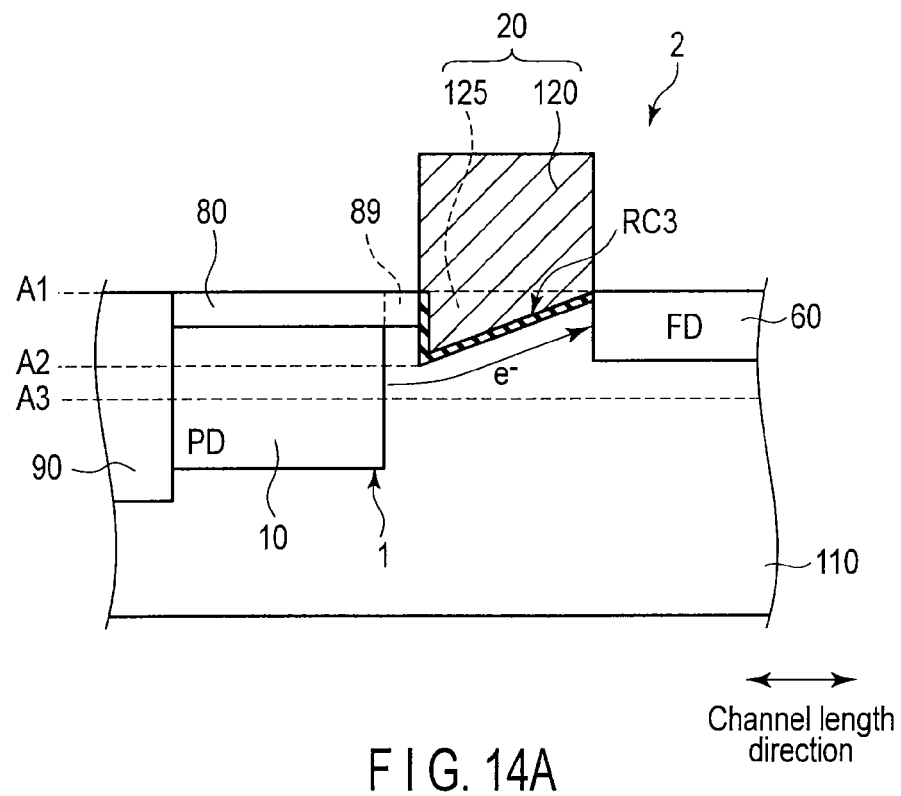
FIG. 14A is a view showing a modification of the solid-state imaging device according to the embodiment.
Figure 14B:
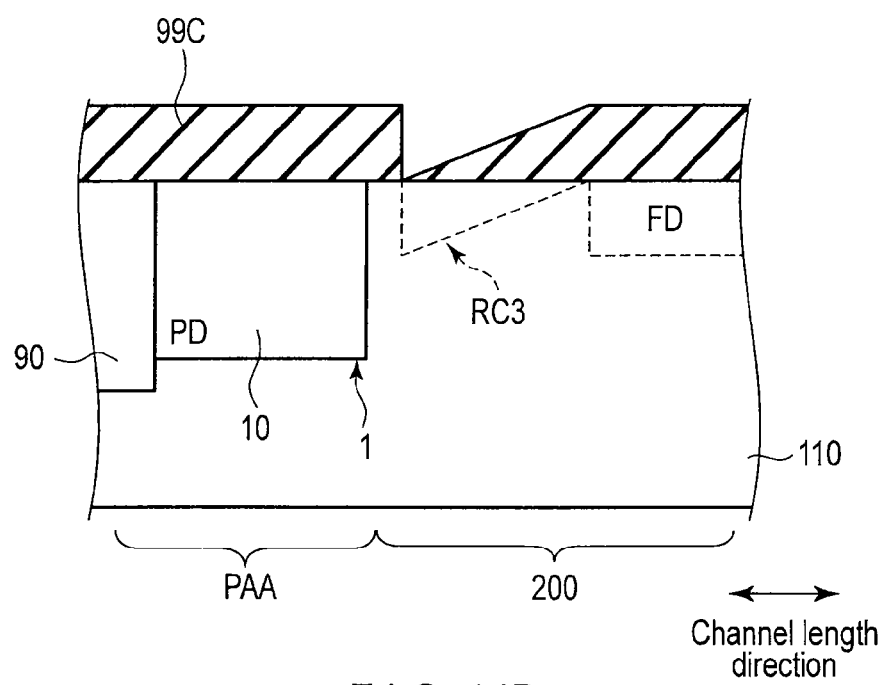
FIG. 14B is a view showing a modification of the solid-state imaging device according to the embodiment.
Figure 15:
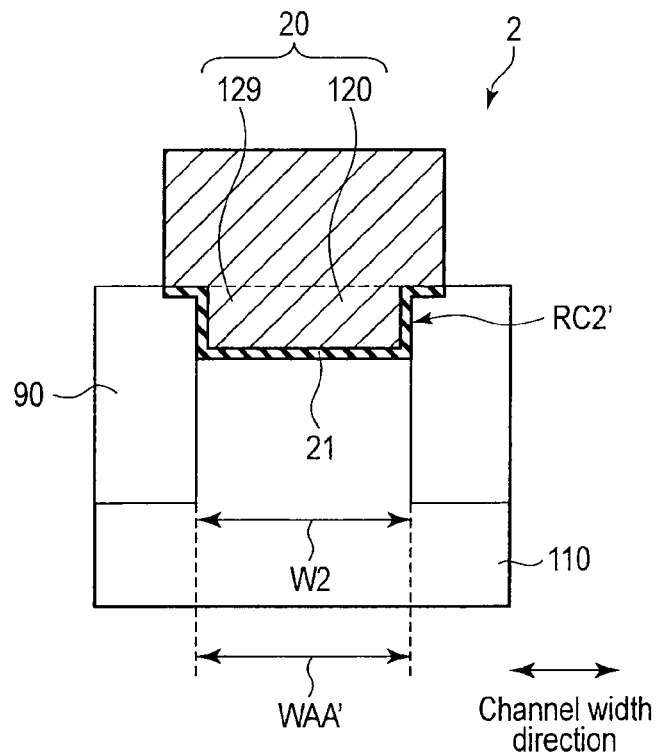
FIG. 15 is a view showing a modification of the solid-state imaging device according to the embodiment.

FIG. 14A, FIG. 14B, and FIG. 15 are views showing a modification of the transfer gate 2 included in the unit cell UC of the image sensor according to this embodiment.

As shown in FIG. 14A, a cross-sectional shape of the embedded portion 121 included in the gate electrode 20 of the transfer gate 2 is not restricted to a rectangular shape. For example, each of the embedded portion 125 in the transfer gate 2 and trench RC3 in which the embedded portion is provided may have a triangular cross-sectional shape in the channel length direction of the transistor.

In the transfer gate 2 shown in FIG. 14A, in the channel length direction of the transistor, a bottom part of one end of the embedded portion 125 on the photodiode 1 side is arranged near a position A3 of the center of the impurity concentration of the photodiode 1. Further, in the channel length direction of the transistor, a bottom part of the other end of the embedded portion 125 on the floating diffusion 6 side is arranged near a front surface A1 of the semiconductor substrate 110.

The bottom part of the embedded portion 125 on the floating diffusion 6 side is arranged at substantially the same position as the position of the upper surface of the floating diffusion 6. It is preferable for the bottom part of the embedded portion 125 on the photodiode 1 side to be arranged at substantially the same position as the position A3 of the center of the impurity concentration of the photodiode 1.

In the transfer gate 2 depicted in FIG. 14A, the position of the bottom part at one end of the embedded portion 125 of the gate electrode 20 is different from the position of the bottom part at the other end of the same in the channel length direction of the transistor 2. In the gate electrode 20 of the transfer gate 2, the bottom part of the embedded portion 125 on the floating diffusion 6 side is placed to be closer to the surface side of the semiconductor substrate 110 (the interlayer insulating film 75 side) in the vertical direction with respect to the surface of the semiconductor substrate as compared with the bottom part of the embedded portion 125 on the photodiode 1 side. In the vertical direction with respect to the surface of the semiconductor substrate 110, the position of the bottom part of the embedded portion 125 on the floating diffusion 6 side is arranged between the position A2 of the bottom part of the embedded portion 125 on the photodiode 1 side and the surface A1 of the semiconductor substrate 110.

In the configuration of the transfer gate 2 as shown in FIG. 7A and FIG. 7B, to fetch a signal charge from the photodiode 1, the bottom part of the impurity semiconductor layer 6 as the floating diffusion 6 is formed at a deeper position than the bottom part of the embedded portion 121. As with the example shown in FIG. 7A and FIG. 7B, when the entire bottom part of the embedded portion of the gate electrode 20 is set to the position of the center A3 of the impurity concentration of the photodiode, the impurity semiconductor layer 60 of the floating diffusion 6 is formed at a deep position in the semiconductor substrate 110.

The position of the bottom part of the embedded portion 121 of the gate electrode 20 in the transfer gate 2 gradually recedes toward the bottom part of the semiconductor substrate 110 as getting closer to the photodiode 1 side from the floating diffusion 6 side. It is to be noted that the embedded portion 121 of the gate electrode 20 in the transfer gate 2 may be gradually steeply changed in a similar way to forming a step-like pattern if the bottom part on the photodiode 1 side is placed to be closer to the bottom part side of the semiconductor substrate 110 as compared with the position of the bottom part on the floating diffusion 6 side, for example.

FIG. 14B shows one step of the transfer gate manufacturing process depicted in FIG. 14A. As shown in FIG. 14B, in the transfer gate 2 in which the embedded portion 125 of the gate electrode 20 has the triangular cross-sectional shape in the channel length direction of the transistor depicted in FIG. 14A, for example, a resist mask 99C whose film thickness varies in the region where trench RC3 is formed is formed by intermediate exposure using a grating mask or a halftone mask. For example, in the resist mask 99C, the film thickness on the photodiode forming region PA side is small, and the film thickness on the floating diffusion forming region is larger than the film thickness on the photodiode forming region PA side. With use of the mask 99C whose film thickness varies, trench RC3 having the triangular cross-sectional shape is formed in the semiconductor substrate 110 in the transfer gate forming region 200.

Trenches RC1 and RC3 may be formed in the respective regions 200 and 500 based on steps in the manufacturing process of the transfer gate 2 having the gate electrode 20 in which the position of the bottom part of the embedded portion 125 gradually varies different from the steps in the manufacturing process of the amplification transistor 5 having the gate electrode 50 including the embedded portion 151.

As shown in FIG. 14A, when the end part of the embedded portion 125 on the floating diffusion 6 side is placed near the upper surface of the floating diffusion 6, the impurity semiconductor layer 60 as the floating diffusion 6 does not have to be formed at a deep position in the semiconductor substrate 110. As a result, the difficulty in process for forming the floating diffusion 6 can be eased, and a manufacturing cost of the image sensor can be reduced.

In this case, since the bottom part of the embedded portion 125 of the transfer gate on the photodiode 1 side is arranged near the position A3 of the center of the impurity concentration of the photodiode 1 in the vertical direction with respect to the surface of the semiconductor substrate 110, transfer of a signal charge of the photodiode 1 can be relatively easily carried out.

As shown in FIG. 15, in the gate electrode 20 of the transfer gate 2, the gate insulating film 21 on each side surface of the embedded portion 121 in the channel width direction may be in contact with the element isolating layer (for example, the impurity semiconductor layer) 90. That is, in the channel width direction, the semiconductor region 110 does not have to be present between the embedded portion 121 and the element isolating layer 90 in the transfer gate 2. The width W2 of the embedded portion 121 in the channel width direction of the transistor is substantially equal to the interval WAA' between the element isolating layers 90 in the transfer gate forming region in the channel width direction of the transistor.

As described above, in the transfer gate 2, when the position of the entire bottom part of the embedded portion 121 is close to the position of the center of the impurity concentration of the photodiode, the signal charge from the photodiode 1 can be efficiently transferred to the floating diffusion 6.

As described above, as with the image sensor according to the embodiment, the modifications of the image sensor according to the embodiment can improve the picture quality of an image formed by the image sensor.

(3) Application Example

An application example of the solid-state imaging device according to each embodiment will now be described with reference to FIG. 16.

The solid-state imaging device (the image sensor) according to the embodiment is modularized and applied to a digital camera or a camera-equipped mobile phone.

Figure 16:
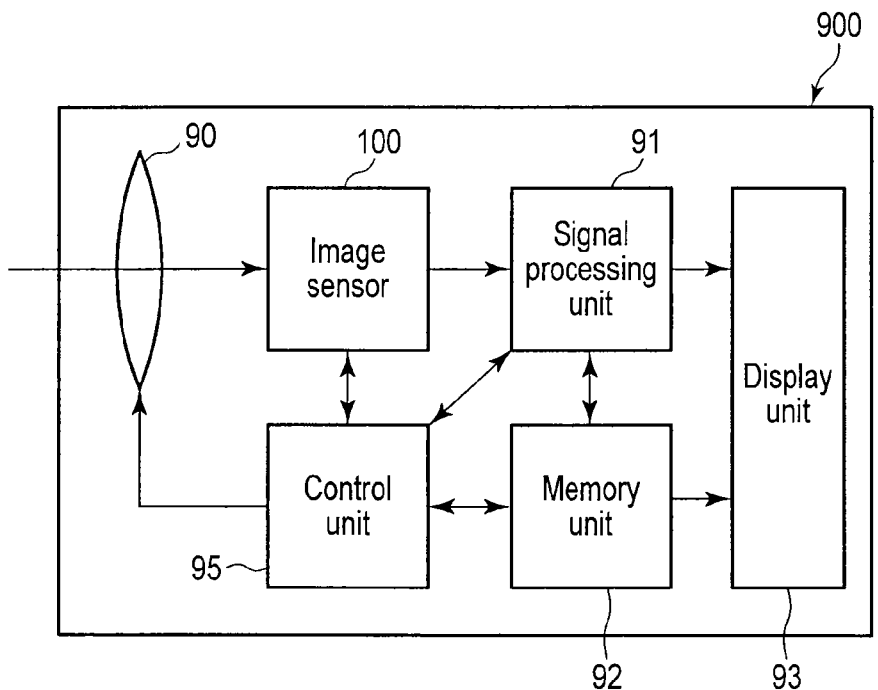
FIG. 16 is a view showing an application example of the solid-state imaging device according to the embodiment.

FIG. 16 is a block diagram showing an application example of the image sensor according to this embodiment.

A camera (or a camera-equipped mobile phone) 900 including the image sensor 100 according to this embodiment includes, for example, a signal processing unit 91, an optical lens unit 90, a memory unit 92, a display unit 93, and a control unit 95 besides the image sensor 100.

The image sensor 100 converts incident light (light from a subject) associated with an image into an electrical signal. The optical lens unit (a lens unit) 90 condenses the incident light (the light from the subject) onto the image sensor 100 and forms an image associated with the incident light on the image sensor 100. The optical lens unit 90 includes lenses and can mechanically or electrically control optical characteristics (for example, a focal length).

The signal processing unit (for example, a digital signal processor: DSP) 91 processes an electrical signal output from the image sensor 100. The memory unit 92 stores a signal from the DSP 91. The memory unit 92 can store signals and data supplied from the outside.

The display unit 93 displays a signal from the DSP 91 or a signal from the memory unit 92. The signal from the DSP 91 or the signal from the memory unit 92 is image data (still picture data or moving picture data) associated with the light from the subject acquired by the image sensor 100. The control unit 95 controls operations of the respective constituent units 90, 91, 92, 93, and 100 in the camera module.

The camera module and the camera including the image sensor according to this embodiment can improve the picture quality of an image to be formed based on the configuration of the transistor in the unit cell of the image sensor 100 according to the foregoing embodiment.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A solid-state imaging device comprising:
a unit cell forming region provided in a pixel array of a semiconductor substrate;
a pixel which is provided in the unit cell forming region and generates a signal charge based on a light signal from a subject;
an amplification transistor which is provided in the unit cell forming region and amplifies a potential associated with the signal charge transferred from the pixel to a floating diffusion, the amplification transistor including a gate electrode having one or more first embedded portions embedded in one or more first trenches in the semiconductor substrate through a first gate insulating film; and
a transfer gate which is provided between the pixel and the floating diffusion in the unit cell forming region and controls transfer of the signal charge with respect to the floating diffusion,
wherein the transfer gate includes a gate electrode having one or more second embedded portions, the one or more second embedded portions are embedded in one or more second trenches in the semiconductor substrate through a second gate insulating film, respectively,
wherein, in the vertical direction with respect to the surface of the semiconductor substrate, a position of a bottom part of the one or more second embedded portions on the floating diffusion side is provided between a position of the bottom part of the one or more second embedded portions on the pixel side and the surface of the semiconductor substrate.

2. The device according to claim 1, wherein, in a channel width direction of the amplification transistor, a side surface of each of the one or more first embedded portions faces a semiconductor region.

3. The device according to claim 1, wherein a dimension of each of the one or more first trenches in a channel width direction of the amplification transistor is smaller than a gate width of the amplification transistor.

4. The device according to claim 1, wherein a dimension of each of the one or more first embedded portions in a channel length direction of the amplification transistor is equal to or below a dimension of the gate electrode in the channel length direction of the amplification transistor.

5. The device according to claim 1, wherein a channel width of the amplification transistor is larger than a dimension of an active region where the amplification transistor is provided in a channel width direction of the amplification transistor, and a channel length of the amplification transistor is larger than a dimension between a source and a drain of the amplification transistor in a channel length direction of the amplification transistor.

6. The device according to claim 1, wherein, in a vertical direction with respect to a surface of the semiconductor substrate, a position of a bottom part of each of the one or more first embedded portions is arranged to be closer to a bottom part side of the semiconductor substrate than a bottom part of an element isolating layer surrounding the unit cell forming region.

7. The device according to claim 1, wherein the one or more first embedded portions including a single first embedded portion, and a whole side surface of the single first embedded portion in a channel width direction of the amplification transistor is not in contact with an element isolating layer surrounding the unit cell forming region.

8. The device according to claim 1, wherein the one or more first embedded portions includes the two first embedded portions, and one of the two first embedded portions is provided at one end of the gate electrode in a channel width direction of the amplification transistor and the other of the two first embedded portions is provided at the other end of the gate electrode in the channel width direction of the amplification transistor.

9. The device according to claim 1, wherein, in the vertical direction with respect to the surface of the semiconductor substrate, a position of a bottom part of each of the one or more second embedded portions is arranged near the center of impurity concentration of an impurity layer forming the pixel.

10. The device according to claim 1, wherein the one or more second embedded portions has a triangular cross-sectional shape in a channel length direction of the transfer gate, an end part of each of the one or more second embedded portions on the pixel side is placed on the bottom part side of the semiconductor substrate away from the surface of the pixel, and an end part of each of the one or more second embedded portions on the floating diffusion side is placed at the same height as a surface of the floating diffusion on the side where the gate electrode of the transfer gate is provided.

11. The device according to claim 1, wherein a dimension of each of the one or more second embedded portions in the channel width direction of the transfer gate is equal to a dimension of an active region where the transfer gate is provided in the channel width direction of the transfer gate.

12. A camera comprising: the solid-state imaging device according to claim 1; and a signal processing circuit to process a signal associated with light from a subject acquired by the solid-state imaging device and form image data.

13. A solid-state imaging device comprising:
a unit cell forming region provided in a semiconductor substrate;
a pixel which is provided in the unit cell forming region and generates a signal charge based on a light signal from a subject;
floating diffusion to which the signal charge is transferred; and
transistors which are provided in the unit cell forming region and control an operation of the pixel, wherein at least one of the transistors includes a gate electrode having one or more embedded portions embedded in trenches in the semiconductor substrate through a gate insulating film, wherein the at least one transistor including the gate electrode having the one or more embedded portions is a transfer gate, and the transfer gate is provided between the pixel and the floating diffusion and controls transfer of the signal charge from the pixel to the floating diffusion, wherein an end part of the one or more embedded portions of the transfer gate on the pixel side is placed to be closer to a bottom part side of the semiconductor substrate than an upper surface of the pixel, and an end part of the one or more embedded portions on the floating diffusion side is placed at the same height as the upper surface of the floating diffusion on a side where the gate electrode of the transfer gate is provided.

14. The device according to claim 13, wherein a channel width of the at least one transistor including the gate electrode having the embedded portions is larger than a dimension of an active region where the at least one transistor is provided in a channel width direction of the at least one transistor.

15. The device according to claim 13, wherein, in a vertical direction with respect to a surface of the semiconductor substrate, a position of a bottom part of each of the one or more embedded portions of the transfer gate is arranged near the center of impurity concentration of an impurity layer forming the pixel.

* * * * *